(12) United States Patent  
Kuromitsu et al.

(10) Patent No.: US 9,066,433 B2  
(45) Date of Patent: Jun. 23, 2015

(54) POWER MODULE SUBSTRATE, POWER MODULE SUBSTRATE WITH HEAT SINK, POWER MODULE, AND METHOD OF MANUFACTURING POWER MODULE SUBSTRATE

(75) Inventors: Yoshirou Kuromitsu, Saitama (JP); Yoshiyuki Nagatomo, Saitama (JP); Nobuyuki Terasaki, Saitama (JP); Toshio Sakamoto, Kitamoto (JP); Kazunari Maki, Saitama (JP); Hiroyuki Mori, Tsukuba (JP); Isao Arai, Naka-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/238,097

(22) PCT Filed: Aug. 10, 2012

(86) PCT No.: PCT/JP2012/070484  
§ 371 (c)(1),  
(2), (4) Date: Feb. 10, 2014

(87) PCT Pub. No.: WO2013/024813  
PCT Pub. Date: Feb. 21, 2013

(65) Prior Publication Data  
US 2014/0192486 A1    Jul. 10, 2014

(30) Foreign Application Priority Data

Aug. 12, 2011  (JP) ................. 2011-176712  
Aug. 12, 2011  (JP) ................. 2011-176881

(51) Int. Cl.  
*H01L 23/10*    (2006.01)  
*H01L 23/34*    (2006.01)  
(Continued)

(52) U.S. Cl.  
CPC ........... *H05K 3/103* (2013.01); *Y10T 29/49155* (2015.01); *H01L 23/3735* (2013.01);  
(Continued)

(58) Field of Classification Search  
USPC .................. 257/706, 707, 762, 691; 438/122  
See application file for complete search history.

(56) References Cited

U.S. PATENT DOCUMENTS 6,534,877 B2 * 3/2003 Ellis et al. ...................... 257/779  
6,747,358 B1 * 6/2004 Rissman et al. ............... 257/762

FOREIGN PATENT DOCUMENTS

JP    03-060184 A    3/1991  
JP    03-060185 A    3/1991  
(Continued)

OTHER PUBLICATIONS

International Search Report dated Oct. 9, 2012, issued for PCT/JP2012/070484.

*Primary Examiner* — S. V. Clark  
(74) *Attorney, Agent, or Firm* — Locke Lord LLP; James E. Armstrong, IV; Nicholas J. DiCeglie, Jr.

(57) ABSTRACT

A power module substrate includes an insulating substrate, and a circuit layer that is formed on one surface of the insulating substrate. The circuit layer is formed by bonding a first copper plate onto one surface of the insulating substrate. Prior to bonding, the first copper plate has a composition containing at least either a total of 1 to 100 mol ppm of one or more kinds among an alkaline-earth element, a transition metal element, and a rare-earth element, or 100 to 1000 mol ppm of boron, the remainder being copper and unavoidable impurities.

16 Claims, 20 Drawing Sheets

(51) Int. Cl.
*H05K 3/10* (2006.01)
*H01L 23/373* (2006.01)
*H05K 1/09* (2006.01)
*H05K 3/38* (2006.01)
*H05K 1/02* (2006.01)
*C04B 35/645* (2006.01)
*C04B 37/02* (2006.01)
*H05K 1/03* (2006.01)
*H05K 3/00* (2006.01)
*H01L 23/00* (2006.01)

(52) U.S. Cl.
CPC .......... *H01L23/3736* (2013.01); *H05K 1/0306* (2013.01); *H05K 1/09* (2013.01); *H05K 3/0061* (2013.01); *H05K 3/38* (2013.01); *H05K 1/0204* (2013.01); *H01L 2224/32225* (2013.01); *H01L 24/29* (2013.01); *H01L 24/32* (2013.01); *H01L 24/83* (2013.01); *H01L 2224/29111* (2013.01); *H01L 2224/83455* (2013.01); *C04B 35/645* (2013.01); *C04B 37/021* (2013.01); *C04B 37/025* (2013.01); *C04B 37/026* (2013.01); *C04B 2237/064* (2013.01); *C04B 2237/121* (2013.01); *C04B 2237/124* (2013.01); *C04B 2237/125* (2013.01); *C04B 2237/127* (2013.01); *C04B 2237/343* (2013.01); *C04B 2237/366* (2013.01); *C04B 2237/402* (2013.01); *C04B 2237/407* (2013.01); *C04B 2237/54* (2013.01); *C04B 2237/60* (2013.01); *C04B 2237/704* (2013.01); *C04B 2237/706* (2013.01); *C04B 2237/708* (2013.01); *C04B 2237/86* (2013.01)

(56) References Cited

FOREIGN PATENT DOCUMENTS

| JP | 03-114289 A | 5/1991 |
| JP | 04-056754 A | 2/1992 |
| JP | 04-162756 A | 6/1992 |
| JP | 05-170564 A | 7/1993 |
| JP | 2000-212660 A | 8/2000 |
| JP | 3171234 B2 | 5/2001 |
| JP | 3211856 B2 | 9/2001 |
| JP | 2011-066385 A | 3/2011 |
| JP | 2011-066405 A | 3/2011 |

* cited by examiner

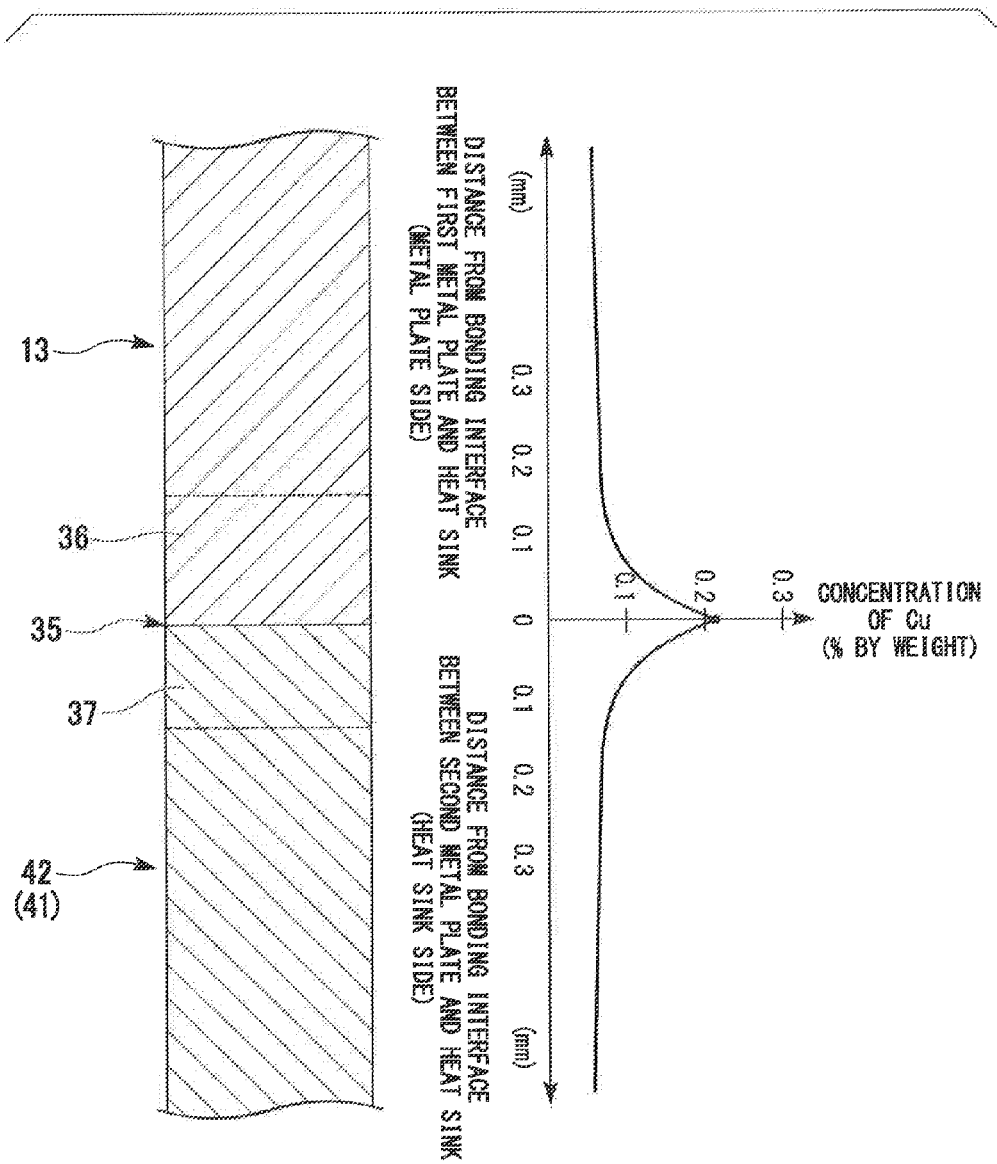

POWER MODULE SUBSTRATE, POWER MODULE SUBSTRATE WITH HEAT SINK, POWER MODULE, AND METHOD OF MANUFACTURING POWER MODULE SUBSTRATE

CROSS REFERENCE TO RELATED APPLICATIONS

This application is a National Phase application filed under 35 USC 371 of PCT International Application No. PCT/EP2012/070484 with an International Filing Date of Aug. 10, 2012, which claims under 35 U.S.C. §119(a) the benefit of Japanese Application No. 2011-176712, filed Aug. 12, 2011 and Japanese Application No. 2011-176881, filed Aug. 12, 2011, the entire contents of which are incorporated herein by reference.

BACKGROUND OF THE INVENTION

1. Field of the Invention

The present invention relates to a power module substrate used in a semiconductor apparatus that controls a large current and a high voltage, a power module substrate with a heat sink, a power module, and a method of manufacturing a power module substrate.

Priority is claimed on Japanese Patent Application Nos. 2011-176712 and 2011-176881, filed Aug. 12, 2011, the contents of which are incorporated herein by reference.

2. Description of Related Art

Among semiconductor devices, a power module that supplies power has a relatively high amount of heat generation. Therefore, as a substrate on which the power module is mounted, for example, a power module substrate, which is provided with an insulating substrate formed from AlN (aluminum nitride), $Al_2O_3$ (alumina). $Si_3N_4$ (silicon nitride), or the like, a circuit layer that is formed by bonding a first metal plate onto one surface side of the insulating substrate, and a metal layer that is formed by bonding a second metal plate onto the other surface side of the insulating substrate, is used.

In the above described power module substrate, a semiconductor device such as a power device is mounted on the circuit layer through a solder material.

For example, PTL 1 suggests a power module substrate which is formed by using an aluminum plate as the first metal plate (circuit layer) and the second metal plate (metal layer).

In addition. PTL 2 and PTL 3 suggest a power module substrate which is formed by using a copper plate as the first metal plate (circuit layer) and the second metal plate (metal layer), and by directly bonding the copper plate onto the insulating substrate according to a DBC method. In addition, in FIG. 1 of PTL 2, a power module substrate with a heat sink in which an aluminum heat sink is bonded to the above-described power module substrate using an organic heat resistant adhesive is disclosed.

CITATION LIST

Patent Literature

[PTL 1] Japanese Patent No. 3171234
[PTL 2] Japanese Unexamined Patent Application, First Publication No. H04-162756
[PTL 3] Japanese Patent No. 3211856

SUMMARY OF INVENTION

Technical Problem

However, in the power module substrate which is described in PTL1, the aluminum plate is used as the first metal plate that forms the circuit layer. When comparing copper and aluminum, thermal conductivity of the aluminum is lower than that of copper. Accordingly, in the case of using an aluminum plate as the circuit layer, heat transferred from a heat generating body such as an electrical component or the like which is mounted on the circuit layer cannot be spread and radiated compared to the case of using a copper plate. Accordingly, in a case in which power density increases due to a decrease in size and an increase in output of an electronic component, there is a concern that heat cannot be sufficiently radiated.

In PTL 2 and PTL 3, since the circuit layer is formed by the copper plate, heat transferred from the heat generating body such as the electrical component that is mounted on the circuit layer can be effectively radiated.

However, in the above-described power module substrate, a cooling and heating cycle is loaded in a usage environment thereof. However, as described in PTL 2 and PTL 3, in the case where the circuit layer and the metal layer are formed by the copper plate, a shear stress caused by a difference in coefficient of thermal expansion between the insulating substrate and the copper plate due to the above-described cooling and heating cycle is applied to the copper plate. Therefore, there is a problem in that the copper plate is strain-hardened, and thus cracking and the like occur in the insulating substrate.

In addition, in the power module substrate with a heat sink which is described in PTL 2, a copper plate is provided between the aluminum heat sink and the insulating substrate. Due to this configuration, a thermal strain caused by a difference in a coefficient of thermal expansion between the heat sink and the insulating substrate is not sufficiently mitigated by the copper plate, and thus there is a problem in that cracking or the like tends to occur in the insulating substrate during loading of the cooling and heating cycle.

The present invention has been made in consideration of the above-described circumstances, and an object thereof is to provide a power module substrate and a power module substrate with a heat sink which are capable of effectively radiating heat transferred from the electronic component mounted on the circuit layer and which are capable of suppressing the occurrence of cracking in the insulating substrate during loading of a cooling and heating cycle, a power module, and a method of manufacturing a power module substrate.

Solution to Problem

According to an aspect of the present invention, there is provided a power module substrate. The substrate includes an insulating substrate, and a circuit layer that is formed on one surface of the insulating substrate. The circuit layer is formed by bonding a first copper plate onto the one surface of the insulating substrate. Prior to bonding, the first copper plate has a composition containing at least either a total of 1 to 100 mol ppm of one or more kinds among an alkaline-earth element, a transition metal element, and a rare-earth element, or 100 to 1000 mol ppm of boron, the remainder being copper and unavoidable impurities.

In addition, the power module substrate may further include a metal layer that is formed on the other surface of the insulating substrate. The metal layer may be formed by bonding an aluminum plate onto the other surface of the insulating substrate.

In the power module substrate which has the above-described configuration, since the circuit layer on which an electronic component or the like is mounted is formed by the first copper plate, heat generated from the electronic component or the like can sufficiently spread, and thus radiation of heat can be promoted.

In addition, prior to bonding, the first copper plate that forms the circuit layer may have a composition containing at least either a total of 1 to 100 mol ppm of one or more kinds among an alkaline-earth element, a transition metal element, and a rare-earth element, or 100 to 1000 mol ppm of boron, the remainder being copper and unavoidable impurities.

Accordingly, at least one or more kinds of elements among the alkaline-earth element, the transition metal element, the rare-earth element, and the boron react with S (sulfur) that is present as one of unavoidable impurities in copper to generate a sulfide, and thus an effect of S can be suppressed. Accordingly, recovery and recrystallization progresses in the circuit layer at a particularly high temperature region during a cooling and heating cycle, and a strain of the circuit layer that is strain-hardened by a shear stress caused by a difference in a coefficient of thermal expansion between the insulating substrate and the circuit layer decreases, and thus the stress that is loaded on the insulating substrate during the cooling and heating cycle is reduced. As a result, occurrence of cracking in the insulating substrate during loading of the cooling and heating cycle can be suppressed.

In a case where the total content of the alkaline-earth element, the transition metal element, and the rare-earth element is less than 1 mol ppm, or the content of boron is less than 100 mol ppm, there is a concern that the effect of S present in copper cannot be sufficiently suppressed. In addition, in a case where the total content of the alkaline-earth element, the transition metal element, and the rare-earth element exceeds 100 mol ppm, or the content of boron exceeds 1000 mol ppm, there is a concern that the circuit layer (first copper plate) can be hardened or thermal conductivity may decrease due to these elements.

Therefore, the total content of one or more kinds among the alkaline-earth element, the transition metal element, and the rare-earth element is set to a range of 1 to 100 mol ppm, or the content of boron is set to a range of 100 to 1000 mol ppm.

It is preferable that, prior to bonding, the first copper plate forming the circuit layer have a composition containing at least either a total of 3 to 50 mol ppm of one or more kinds among an alkaline-earth element, a transition metal element, and a rare-earth element, or 300 to 1000 mol ppm of boron, the remainder being copper and unavoidable impurities.

In this case, since the total content of the alkaline-earth element, the transition metal element, and the rare-earth element is set to 3 mol ppm or more, or the content of boron is set to 300 mol ppm or more, the effect of S in copper can be suppressed, and a recrystallization temperature is lowered, and thus strain hardening can be reliably suppressed. In addition, since the total content of the alkaline-earth element, the transition metal element, and the rare-earth element is set to 50 mol ppm or less, or the content of boron is set to 1000 mol ppm or less, hardening or a decrease in thermal conductivity of the first copper plate can be suppressed.

In addition, in the first copper plate that forms the circuit layer, it is preferable that the content of oxygen be set to 1 ppm by mass or less.

In this case, reaction of at least one or more kinds among the alkaline-earth element, the transition metal element, the rare-earth element, and the boron with oxygen into an oxide is suppressed, and these elements can reliably react with S to generate a sulfide. Accordingly, the content of at least one or more kinds of elements among the alkaline-earth element, the transition metal element, the rare-earth element, and the boron can be sufficient for suppressing the effect of S.

Further, it is preferable that in the metal layer, any one or more kinds of additive elements among Si, Cu, Ag, Zn, Mg, Ge, Ca, Ga, and Li be contained in a bonding interface with the insulating substrate in a solid solution state, and the total concentration of the additive elements in the metal layer in the vicinity of the bonding interface be set in a range of 0.01 to 5% by mass.

In this case, since any one or more kinds of additive elements among Si, Cu, Ag, Zn, Mg, Ge, Ca, Ga and Li are contained in the metal layer in a solid solution state, a portion of the metal layer on a bonding interface side is solid-solution-hardened. According to this, a fracture at the metal layer portion can be prevented.

In addition, since the total concentration of the additive elements in the metal layer in the vicinity of the bonding interface is set to 0.01% by mass or more, a portion of the metal layer on a bonding interface side can be reliably solid-solution-hardened. In addition, since the total concentration of the additive elements in the metal layer in the vicinity of the bonding interface is set to 5% by mass or less, the strength of the metal layer in the vicinity of the bonding interface can be prevented from being excessively increased, and thus when a thermal cycle is loaded on the power module substrate, a thermal strain can be mitigated by the metal layer, and thus occurrence of cracking in the insulating substrate can be suppressed.

Further, it is preferable that in the metal layer, a high additive-element concentration portion, in which the concentration of any one or more kinds of the additive elements among Si, Cu, Ag, Zn, Mg, Ge, Ca, Ga, and Li is set to two or more times the concentration of the additive elements in the metal layer, be formed at the bonding interface with the insulating substrate.

In this case, since the high additive-element concentration portion, in which the concentration of the additive elements is set to two or more times the concentration of the additive elements in the metal layer, is formed at the bonding interface of the metal layer, the bonding strength of the metal layer can be improved by atoms of the additive elements that are present in the vicinity of the interface. The concentration of the additive elements in the metal layer represents a concentration of the additive elements in the metal layer at a portion which is spaced from the bonding interface by a constant distance (for example, 5 nm or more).

In addition, the power module substrate according to another aspect of the present invention may further include a metal layer that is formed on the other surface of the insulating substrate. The metal layer may be formed by bonding a second copper plate to the other surface of the insulating substrate. Prior to bonding, the second copper plate may have a composition containing at least either a total of 1 to 100 mol ppm of one or more kinds among an alkaline-earth element, a transition metal element, and a rare-earth element, or 100 to 1000 mol ppm of boron, the remainder being copper and unavoidable impurities.

In this case, since the metal layer formed by the second copper plate is formed on the other surface of the insulating substrate, heat can spread in the metal layer, and radiation of heat can be further promoted. In addition, the copper plate is bonded onto both surfaces of the insulating substrate, and thus warpage of the insulating substrate can be suppressed.

Further, prior to bonding, the second copper plate may have a composition containing at least either a total of 1 to 100 mol ppm of one or more kinds among the alkaline-earth element, the transition metal element, and the rare-earth element, or 100 to 1000 mol ppm of boron, the remainder being copper and unavoidable impurities.

Accordingly, at least one or more kinds of elements among the alkaline-earth element, the transition metal element, the rare-earth element, and the boron react with S (sulfur) that is present as one of unavoidable impurities in copper to generate a sulfide, and thus an effect of S can be suppressed. Accordingly, recovery and recrystallization progresses in the metal layer at a particularly high temperature region during a cooling and heating cycle, and a strain of the circuit layer that is strain-hardened by a shear stress caused by a difference in a coefficient of thermal expansion between the insulating substrate and the circuit layer decreases, and thus a stress that is loaded on the insulating substrate during the cooling and heating cycle is reduced. As a result, occurrence of cracking in the insulating substrate during loading of the cooling and heating cycle can be suppressed.

It is preferable that, prior to bonding, at least one of the first copper plate and the second copper plate have a composition containing at least either a total of 3 to 50 mol ppm of one or more kinds among the alkaline-earth element, the transition metal element, and the rare-earth element, or 300 to 1000 mol ppm of boron, the remainder being copper and unavoidable impurities.

In this case, since the total content of the alkaline-earth element, the transition metal element, and the rare-earth element is set to 3 mol ppm or more, or the content of boron is set to 300 mol ppm or more, the effect of S in copper can be suppressed, and a recrystallization temperature is lowered, and thus strain hardening can be reliably suppressed. In addition, since the total content of the alkaline-earth element, the transition metal element, and the rare-earth element is set to 50 mol ppm or less, or the content of boron is set to 1000 mol ppm or less, hardening or a decrease in thermal conductivity of the first copper plate and/or the second copper plate can be suppressed.

In addition, it is preferable that in at least one of the first copper plate and the second copper plate, the content of oxygen be set to 1 ppm by mass or less.

In this case, reaction of at least one or more kinds of elements among the alkaline-earth element, the transition metal element, the rare-earth element, and the boron with oxygen into an oxide is suppressed, and these elements can reliably react with S to generate a sulfide. Accordingly, the content of at least one or more kinds among the alkaline-earth element, the transition metal element, the rare-earth element, and the boron can be sufficient for suppressing the effect of S.

According to another aspect of the present invention, there is provided a power module substrate with a heat sink. The substrate includes the above-described power module substrate and a heat sink that is provided on the other surface side of the insulating substrate.

According to the power module substrate which has the above-described configuration, the heat sink is bonded onto the metal layer formed by the aluminum plate or the second copper plate. Accordingly, heat transferred from the power module substrate can be efficiently radiated due to the heat sink. In addition, the thermal strain during loading of the cooling and heating cycle can be mitigated by deformation of the metal layer, and thus cracking of the insulating substrate can be suppressed.

According to still another aspect of the present invention, there is provided a power module with a heat sink. The power module includes the above-described power module substrate with a heat sink, and an electronic component that is mounted on the circuit layer.

In addition, according to still another aspect of the present invention, there is provided a power module including the above-described power module substrate, and an electronic component that is mounted on the circuit layer.

According to the power module having this configuration, heat transferred from the electronic component mounted on the circuit layer can be efficiently radiated, and thus even when a power density (amount of heat generation) of the electronic component is improved, it is possible to sufficiently cope with this situation.

According to still another aspect of the present invention, there is provided a method of manufacturing a power module substrate which is provided with an insulating substrate, a circuit layer formed on one surface of the insulating substrate, and a metal layer formed on the other surface of the insulating substrate. The circuit layer is formed by bonding a first copper plate onto the one surface of the insulating substrate. The metal layer is formed by bonding an aluminum plate onto the other surface of the insulating substrate. Prior to bonding, the first copper plate has a composition containing at least either a total of 1 to 100 mol ppm of one or more kinds among an alkaline-earth element, a transition metal element, and a rare-earth element, or 100 to 1000 mol ppm of boron, the remainder being copper and unavoidable impurities. The method includes a circuit layer forming process of forming the circuit layer by bonding the first copper plate onto the one surface of the insulating substrate, and a first metal layer forming process of forming the metal layer by bonding the aluminum plate onto the other surface of the insulating substrate. In the first metal layer forming process, any one or more kinds of additive elements among Si, Cu, Ag, Zn, Mg, Ge, Ca, Ga, and Li are disposed at a bonding interface of the aluminum plate, and then the aluminum plate is bonded.

According to the method of manufacturing a power module substrate which has this configuration, the above-described power module substrate can be manufactured. In addition, in the first metal layer forming process, since any one or more kinds of additive elements among Si, Cu, Ag, Zn, Mg, Ge, Ca, Ga, and Li are disposed at a bonding interface of the second metal plate, and then the aluminum plate is bonded, the aluminum plate and the insulating substrate can be strongly bonded. In addition, since the elements such as Si, Cu, Ag, Zn, Mg, Ge, Ca, Ga, and Li are elements that lower the melting point of aluminum, a molten metal region can be formed at the bonding interface of the aluminum plate even under a condition of a relative low temperature (for example, 570 to 630° C.). These additive elements may be fixed to a bonding surface of the aluminum plate and the like, or metal foil (brazing material foil) containing these additive elements may be provided on the bonding surface.

Advantageous Effects of Invention

According to the present invention, a power module substrate and a power module substrate with a heat sink which are capable of effectively radiating heat transferred from the electronic component mounted on the circuit layer and which are capable of suppressing occurrence of cracking in the insulating substrate during loading of a cooling and heating cycle, a power module, and a method of manufacturing a power module substrate can be provided.

BRIEF DESCRIPTION OF DRAWINGS

FIG. 3 is an explanatory diagram illustrating an additive element concentration distribution of the metal layer and a heat sink (heat dissipation plate) of the power module substrate according to the first embodiment of the present invention.

DETAILED DESCRIPTION OF THE INVENTION

Hereinafter, embodiments of the present invention will be described with reference to the attached drawings.

Figure 1:
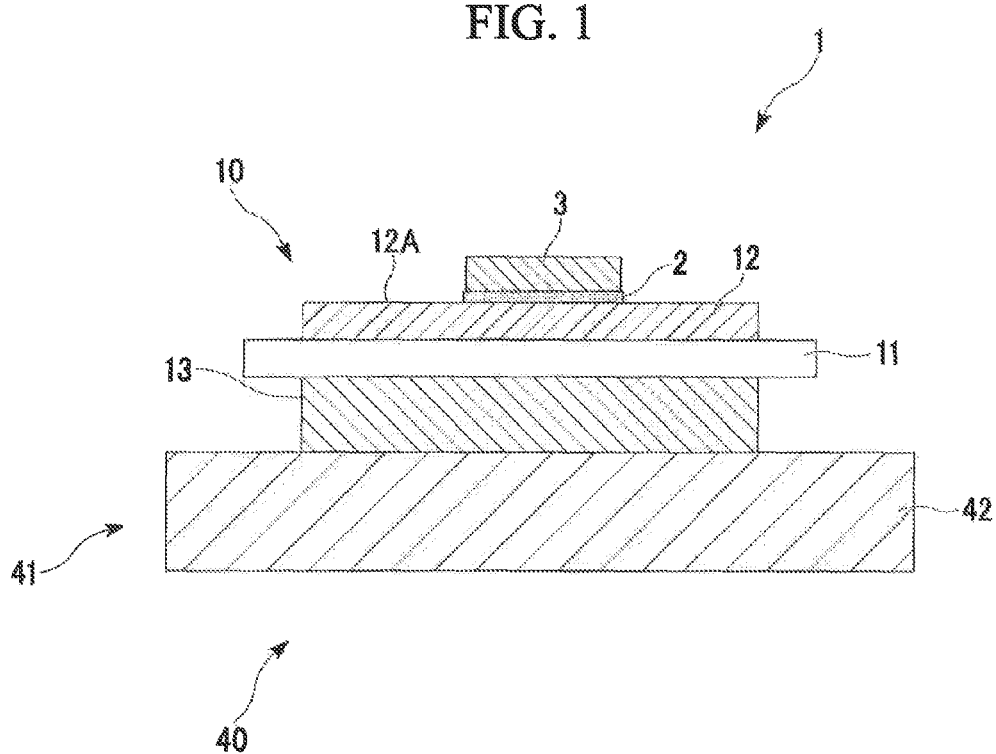
FIG. 1 is a schematic explanatory diagram of a power module substrate and a power module according to a first embodiment of the present invention.

FIG. 1 shows a power module substrate 10, a power module substrate with a heat sink 40, and a power module 1 according to a first embodiment of the present invention.

The power module 1 includes the power module substrate 10, a semiconductor device 3, and a heat sink 41. The power module substrate 10 is provided with a circuit layer 12. The semiconductor device 3 is bonded onto a mounting surface 12A of the circuit layer 12 through a solder layer 2. For example, the solder layer 2 is formed from a Sn—Ag-based, Sn—In-based, or Sn—Ag—Cu-based solder material (so-called lead-free solder material). In this embodiment, a Ni-plated film (not shown) may be provided between the mounting surface 12A of the circuit layer 12 and the solder layer 2.

As shown in FIG. 1, the power module substrate 10 includes a ceramic substrate 11, the circuit layer 12, and a metal layer 13. The circuit layer 12 is formed on one surface (in FIG. 1, the upper surface) of the ceramic substrate 11. The metal layer 13 is formed on the other surface (in FIG. 1, the lower surface) of the ceramic substrate 11.

The ceramic substrate 11 prevents electrical connection between the circuit layer 12 and the metal layer 13, and is composed of $Al_2O_3$ (alumina) with high insulating properties. In addition, the thickness of the ceramic substrate 11 is set in a range of 0.2 to 1.5 mm, and is set to 0.635 mm in this embodiment.

Figure 6:
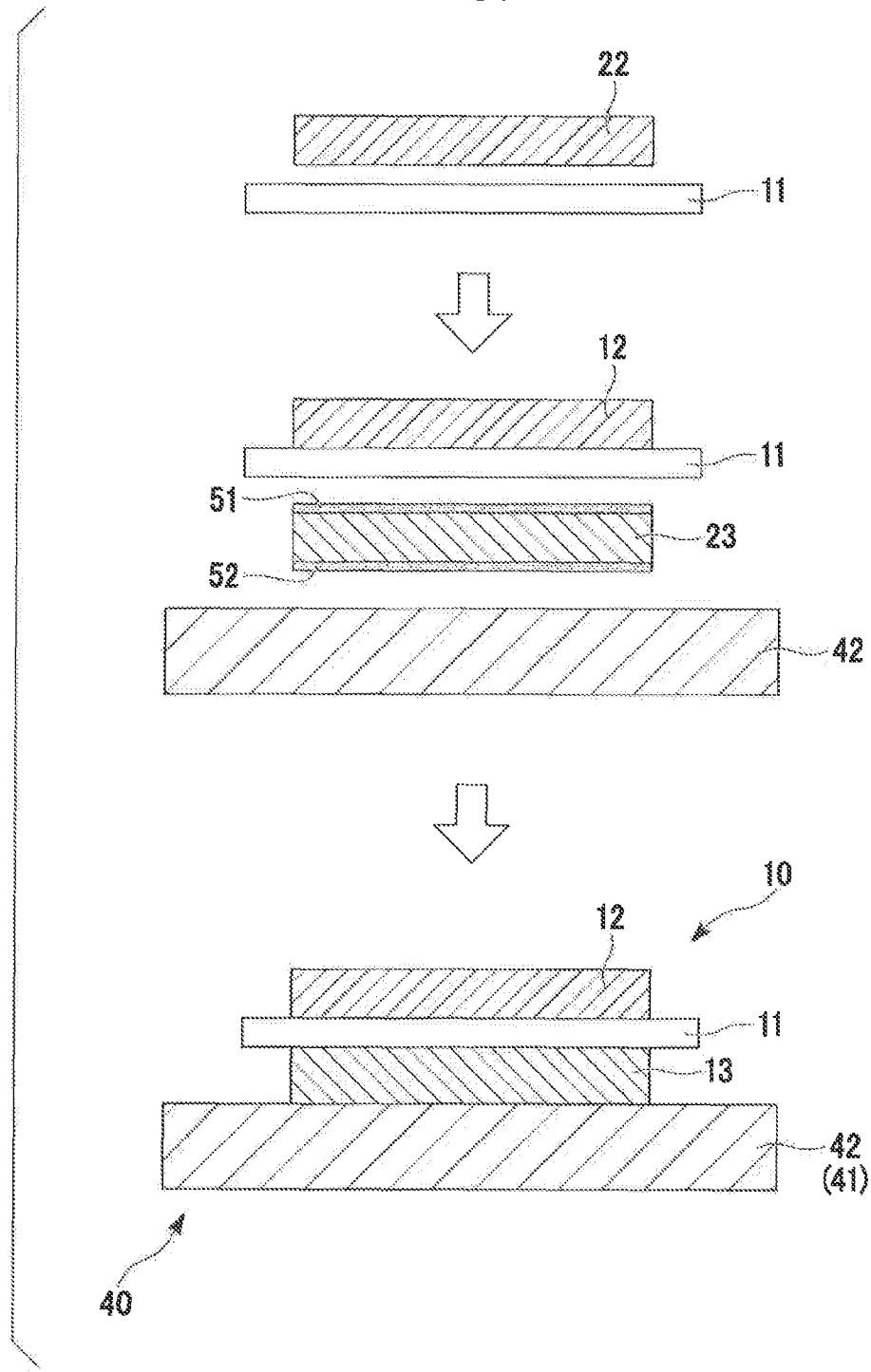
FIG. 6 is an explanatory diagram illustrating the method of manufacturing the power module substrate and the method of manufacturing the power module substrate with a heat sink according to the first embodiment of the present invention.

As shown in FIG. 6, the circuit layer 12 is formed by bonding a first copper plate 22 onto one surface (in FIG. 6, the upper surface) of the ceramic substrate 11. The thickness of the circuit layer 12 is set in a range of 0.1 to 1.0 mm, and is set to 0.3 mm in this embodiment. In addition, a circuit pattern is formed in the circuit layer 12, and one surface (in FIG. 1, the upper surface) is set as the mounting surface 12A on which the semiconductor device 3 is mounted.

Prior to bonding, the first copper plate 22 (circuit layer 12) contains at least either a total of 1 to 100 mol ppm of one or more kinds among an alkaline-earth element, a transition metal element, and a rare-earth element, or 100 to 1000 mol ppm of boron, the remainder being copper and unavoidable impurities, and more preferably, at least either a total of 3 to 50 mol ppm of one or more kinds among an alkaline-earth element, a transition metal element, and a rare-earth element, or 300 to 1000 mol ppm of boron. The content of oxygen is set to 1 ppm by mass or less.

In this embodiment, Mg-doped copper obtained by adding 15 mol ppm of Mg to oxygen-free copper (OFC) having purity of 99.99% by mass or more is used for the first copper plate 22 (circuit layer 12).

As shown in FIG. 6, the metal layer 13 is formed by bonding an aluminum plate 23 onto the other surface (in FIG. 6, the lower surface) of the ceramic substrate 11.

The aluminum plate 23 (metal layer 13) is composed of a rolled plate of aluminum or an aluminum alloy which has purity of 99% by mass or more and a proof stress of 30 N/mm$^2$ or less.

In this embodiment, the aluminum plate 23 (the metal layer 13) is composed of a rolled plate of aluminum (so-called 4N aluminum) having purity of 99.99% by mass or more.

Figure 2A:
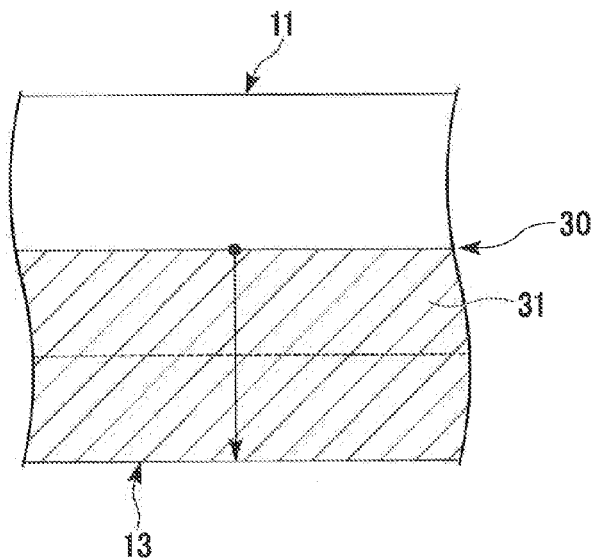
FIG. 2A is an explanatory diagram illustrating a region, at which an additive element concentration distribution is measured, of a metal layer in the power module substrate according to the first embodiment.
Figure 2B:
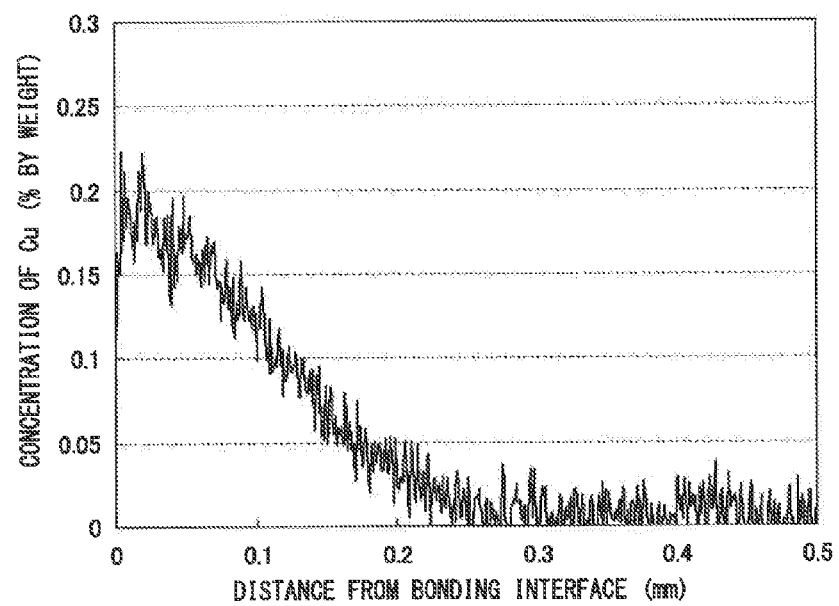
FIG. 2B is an explanatory diagram illustrating the additive element concentration distribution of the metal layer in the power module substrate according to the first embodiment of the present invention.

As shown in FIGS. 2A and 2B, any one or more kinds of additive elements among Si, Cu, Ag, Zn, Mg, Ge, Ca, Ga, and Li are contained in a bonding interface 30 between the ceramic substrate 11 and the metal layer 13 in a solid solution state, and in this embodiment, as the additive element, Cu is contained in a solid solution state.

A concentration gradient layer 31, in which the concentration of the additive element (in this embodiment, the concentration of Cu) gradually decreases as it is spaced from the bonding interface 30 in a lamination direction, is formed in the metal layer 13 in the vicinity of the bonding interface 30. In addition, the concentration of the additive element (in this embodiment, the concentration of Cu) in the concentration gradient layer 31 on a bonding interface 30 side (in the metal layer 13 in the vicinity of the bonding interface 30) is set in a range of 0.01 to 5% by mass.

The concentration of the additive element in the metal layer 13 in the vicinity of the bonding interface 30 represents an average value obtained by carrying out measurement for five points at a position spaced from the bonding interface 30 by 50 μm using EPMA analysis (spot diameter: 30 μm). In addition, a graph of FIG. 2B is obtained on the basis of the concentration at the above-described position of 50 μm by carrying out line analysis at the central portion of the metal layer 13 in the lamination direction.

A heat sink 41 cools down the above-described power module substrate 10. As shown in FIG. 1, the heat sink 41 of this embodiment includes a heat dissipation plate 42 that is bonded onto the other surface side of the metal layer 13 of the power module substrate 10. The heat dissipation plate 42 is composed of a metal material having a proof stress of 100 N/mm$^2$ or more and the thickness thereof is set to 2 mm or more. In this embodiment, the heat dissipation plate 42 is composed of an A6063 alloy (aluminum alloy).

As shown in FIG. 3, at a bonding interface 35 between the metal layer 13 and the heat dissipation plate 42, any one or more kinds of additive elements among Si, Cu, Ag, Zn, Mg, Ge, Ca, Ga and Li are contained in the metal layer 13 and the heat dissipation plate 42 in a solid solution state. In this embodiment, as the additive element, Cu is contained in a solid solution state.

Concentration gradient layers 36 and 37, in which the concentration of the additive element (in this embodiment, the concentration of Cu) gradually decreases as it is spaced from the bonding interface 35 in a lamination direction, is formed in the vicinity of the bonding interface 35 between the metal layer 13 and the heat dissipation plate 42. In addition, the concentration of the additive element (in this embodiment, the concentration of Cu) in the concentration gradient layers 36 and 37 on a bonding interface 35 side (in the vicinity of the bonding interface 35 between the metal layer 13 and the heat dissipation plate 42) is set in a range of 0.01 to 5% by mass.

The concentration of the additive element in the vicinity of the bonding interface 35 between the metal layer 13 and the heat dissipation plate 42 represents an average value obtained by carrying out measurement for five points at a position spaced from the bonding interface 35 by 50 μm using EPMA analysis (spot diameter: 30 μm). In addition, a graph of FIG. 3 is obtained on the basis of the concentration at the above-described position of 50 μm by carrying out line analysis at the central portion of the metal layer 13 and the heat dissipation plate 42 in the lamination direction.

Figure 4:
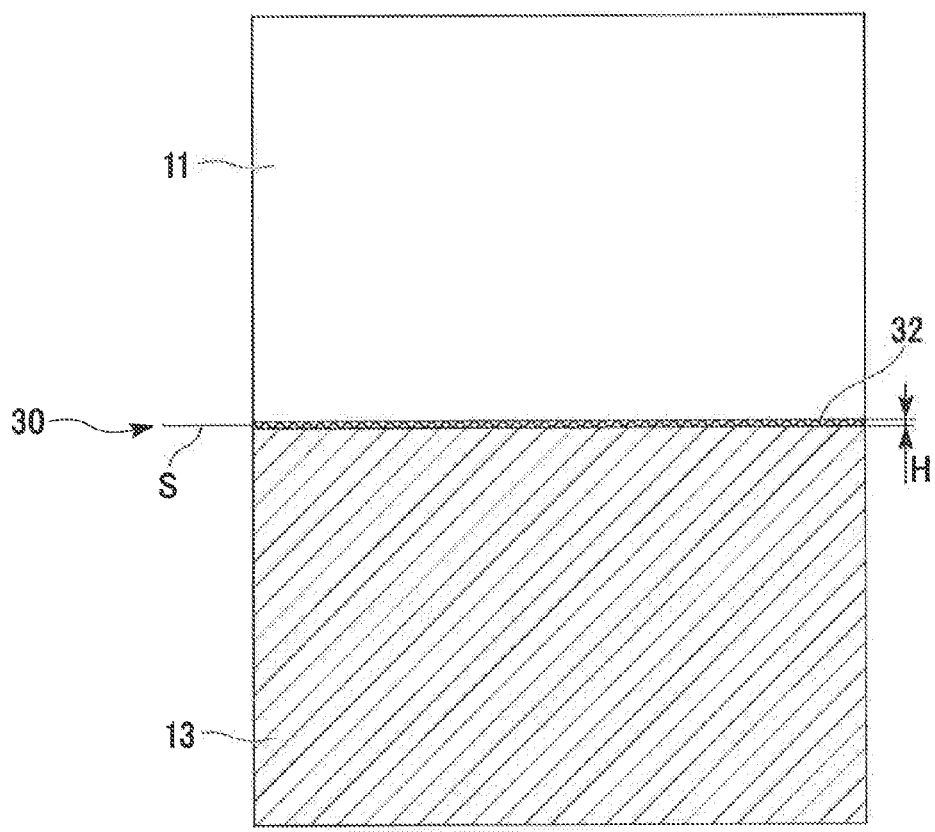
FIG. 4 is a schematic diagram of a bonding interface between the metal layer and a ceramic substrate of the power module substrate according to the first embodiment of die present invention.

In addition, in a case of observing the bonding interface 30 between the ceramic substrate 11 and the metal layer 13 using a transmission electron microscope, as shown in FIG. 4, a high additive-element concentration portion 32 in which the additive element (Cu) is concentrated is formed at the bonding interface 30. In the high additive-element concentration portion 32, the concentration of the additive element (concentration of Cu) is set to two or more times the concentration of the additive element (concentration of Cu) in the metal layer 13. The thickness H of the high additive-element concentration portion 32 is set to 4 nm or less.

Here, in the bonding interface 30 that is observed, the center between an end of the metal layer 13 on a lattice-shaped interface side and an end of the ceramic substrate 11 on a lattice-shaped bonding interface 30 side is set as a reference plane S. In addition, the concentration of the additive element (concentration of Cu) in the metal layer 13 represents a concentration of the additive element (concentration of Cu) in the metal layer 13 at a portion which is spaced from the bonding interface 30 by a constant distance (in this embodiment, 5 nm).

Hereinafter, a method of manufacturing the power module substrate 10 and the power module substrate with a heat sink 40, which have the above-described configuration, will be described with reference to FIGS. 5 to 8.

Figure 5:
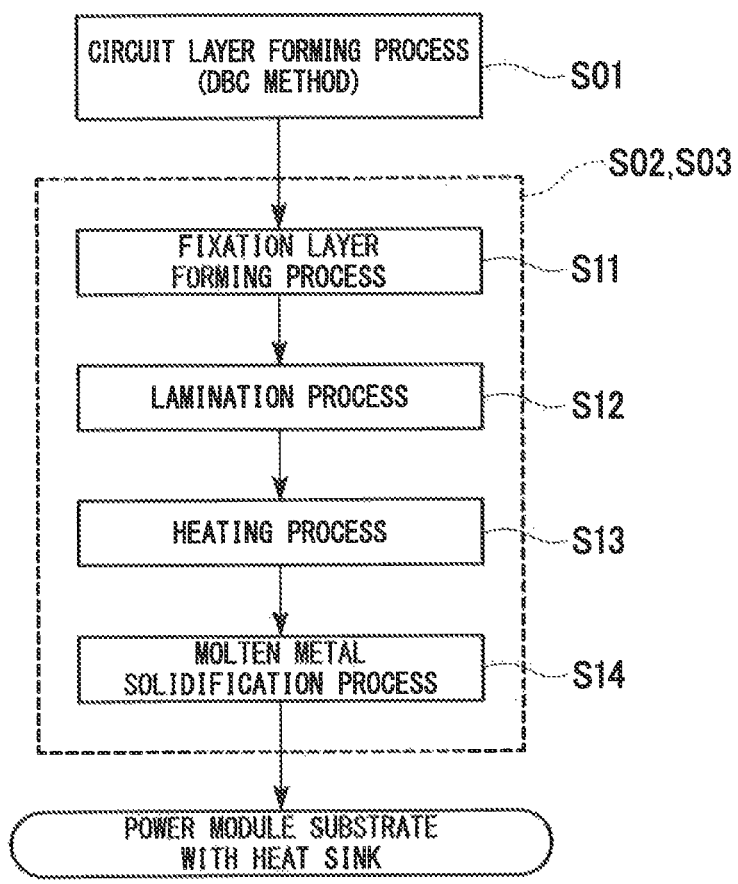
FIG. 5 is a flow chart illustrating a method of manufacturing the power module substrate and a method of manufacturing a power module substrate with a heat sink according to the first embodiment of the present invention.

First, as shown in FIGS. 5 and 6, the first copper plate 22 serving as the circuit layer 12 and the ceramic substrate 11 are bonded to each other (a circuit layer forming process S01). The ceramic substrate 11 is composed of Al$_2$O$_3$, and thus the first copper plate 22 and the ceramic substrate 11 are bonded by a DBC (Direct Bonding Copper) method using a liquid phase in an eutectic range of copper (Cu) and cuprous oxide (Cu$_2$O). Specifically, the first copper plate 22 and the ceramic substrate 11 are brought into contact with each other, and the first copper plate 22 and the ceramic substrate 11 are bonded by carrying out heating at 1075° C. for 10 minutes in a nitrogen gas atmosphere in which a slight amount of oxygen is added.

Next, the aluminum plate 23 serving as the metal layer 13 is bonded onto the other surface side of the ceramic substrate 11 (first metal layer forming process S02), and the aluminum plate 23 and the heat dissipation plate 42 of the heat sink 41 are bonded to each other (heat sink bonding process S03). In this embodiment, the first metal layer forming process S02 and the heat sink bonding process S03 are carried out simultaneously.

The additive element (Cu) is fixed to one surface of the aluminum plate 23 by sputtering to form a first fixation layer 51, and the additive element (Cu) is fixed to the other surface of the aluminum plate 23 by sputtering to form a second fixation layer 52 (fixation layer forming process S11). An amount of the additive element in the first fixation layer 51 and the second fixation layer 52 is set in a range of 0.01 to 10 mg/cm$^2$. In this embodiment, Cu is used as the additive element, and the amount of Cu in the first fixation layer 51 and the second fixation layer 52 is set to 0.08 to 2.7 mg/cm$^2$.

Next, as shown in FIG. 6, the aluminum plate 23 is laminated on the other surface side of the ceramic substrate 11. Further, the heat dissipation plate 42 is laminated on the other surface side of the aluminum plate 23 (lamination process S12).

At this time, as shown in FIG. 6, the ceramic substrate 11, the aluminum plate 23, and the heat dissipation plate 42 are laminated in such a manner that the surface of the aluminum plate 23 on which the first fixation layer 51 is formed faces the ceramic substrate 11, and the surface of the aluminum plate 23 on which the second fixation layer 52 is formed faces the heat dissipation plate 42. That is, the first fixation layer 51 (additive element: Cu) is interposed between the aluminum plate 23 and the ceramic substrate 11, and the second fixation layer 52 (additive element: Cu) is interposed between the aluminum plate 23 and the heat dissipation plate 42.

Next, the first copper plate 22, the ceramic substrate 11, the aluminum plate 23, and the heat dissipation plate 42 are put into a vacuum heating furnace and are heated therein in a state in which these are compressed in a lamination direction (at pressure of 1 to 35 kgf/cm$^2$) (heating process S13). In this embodiment, a pressure inside the vacuum heating furnace is set in a range of $10^{-3}$ to $10^{-6}$ Pa, and a heating temperature is set in a range of 550 to 650° C.

Figure 7:
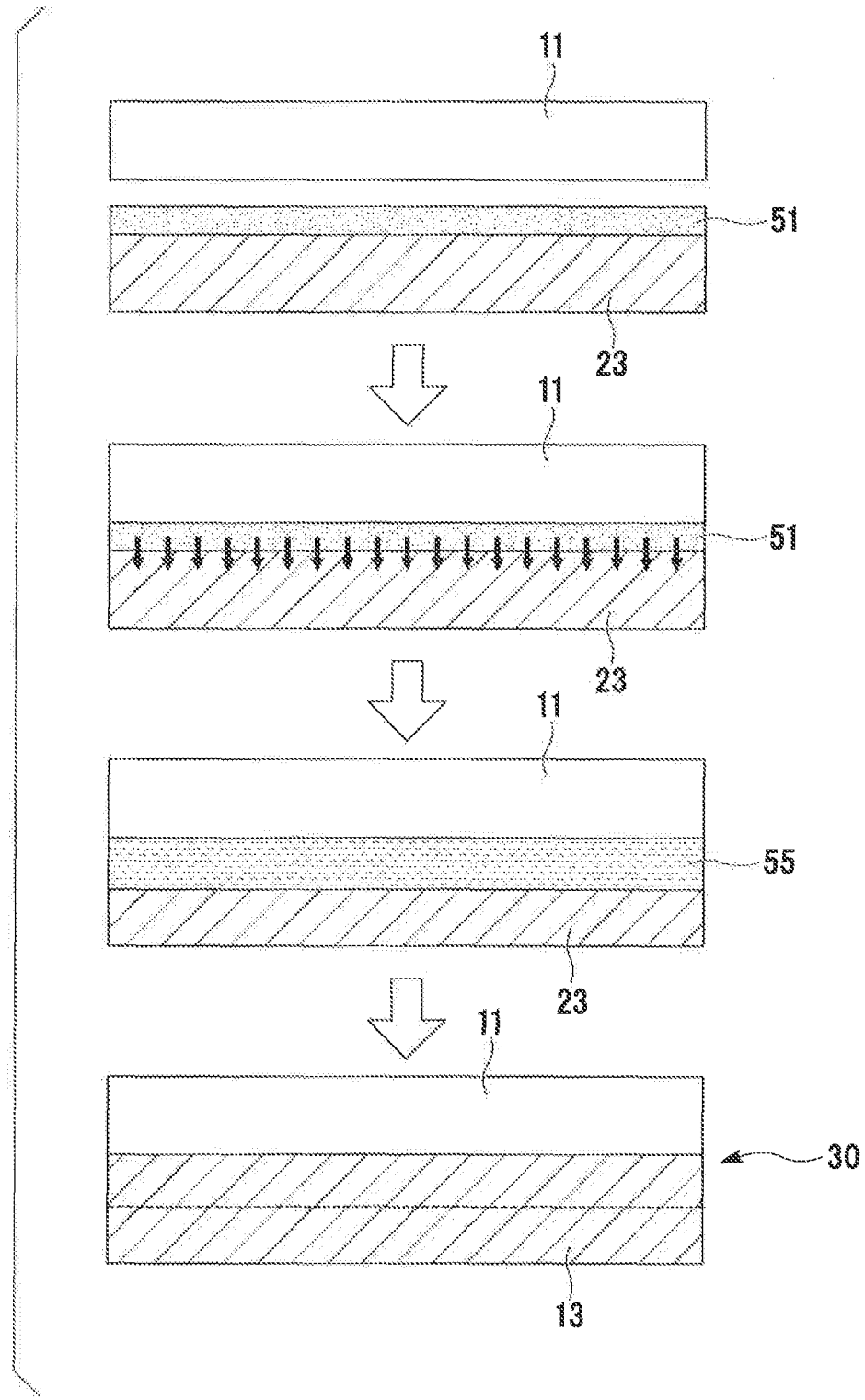
FIG. 7 is an explanatory diagram illustrating the vicinity of the bonding interface between the ceramic substrate and the metal layer (aluminum plate) shown in FIG. 6.

According to this process, as shown in FIG. 7, a first molten metal region 55 is formed at an interface between the aluminum plate 23 and the ceramic substrate 11. The additive element (Cu) of the first fixation layer 51 diffuses toward the aluminum plate 23 side, and thus the concentration of the additive element (concentration of Cu) in the aluminum plate 23 in the vicinity of the first fixation layer 51 increases, and a melting point is lowered, whereby the first molten metal region 55 is formed.

Figure 8:
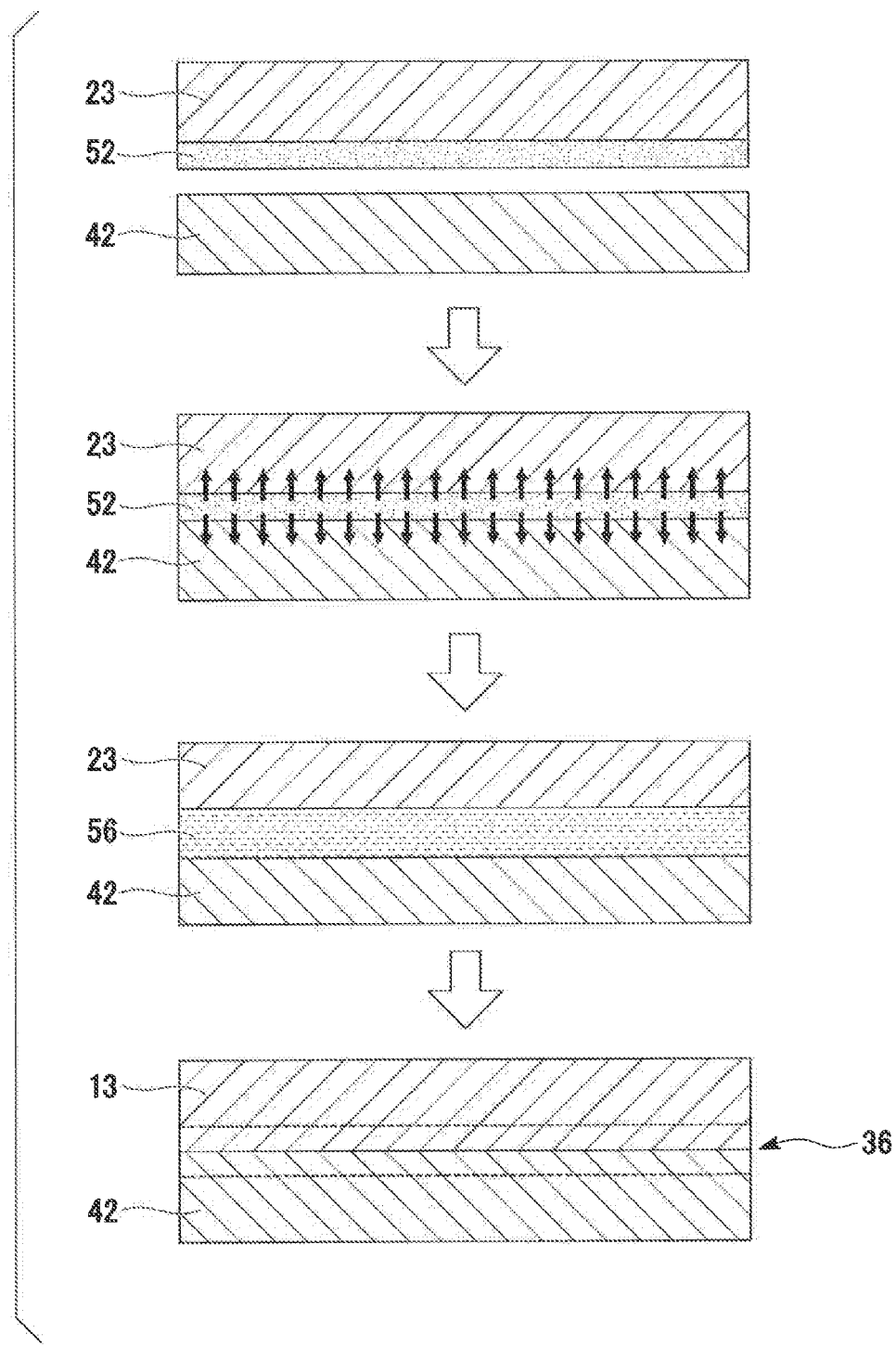
FIG. 8 is an explanatory diagram illustrating the vicinity of the bonding interface between the heat sink (heat dissipation plate) and the metal layer (aluminum plate) shown in FIG. 6.

In addition, as shown in FIG. 8, a second molten metal region 56 is formed at an interface between the aluminum plate 23 and the heat dissipation plate 42. The additive element (Cu) of the second fixation layer 52 diffuses toward the aluminum plate 23 side and the heat dissipation plate 42 side, and thus the concentration of the additive element (concentration of Cu) in the aluminum plate 23 and the heat dissipation plate 42 in the vicinity of the second fixation layer 52 increases, and the melting point is decreased, whereby the second molten metal region 56 is formed.

Next, a temperature is constantly retained in a state in which the first molten metal region 55 and the second molten metal region 56 are formed (molten metal solidification process S14).

According to this process, Cu in the first molten metal region 55 further diffuses toward the aluminum plate 23 side. According to this, the concentration of Cu at a portion that is the first molten metal region 55 gradually decreases, and a melting point thereof is raised, and thus solidification progresses in a state in which a temperature is constantly retained. According to this, the ceramic substrate 11 and the aluminum plate 23 are bonded.

Similarly, Cu in the second molten metal region 56 further diffuses toward the aluminum plate 23 side and the heat dissipation plate 42 side. According to this, the concentration of Cu at a portion that is the second molten metal region 56 gradually decreases, and the melting point thereof is raised, and thus solidification progresses in a state in which a temperature is constantly retained. According to this, the aluminum plate 23 and the heat dissipation plate 42 are bonded.

That is, the ceramic substrate 11 and the aluminum plate 23, and the aluminum plate 23 and the heat dissipation plate 42 are bonded, respectively, by so-called transient liquid phase diffusion bonding.

In this manner, the first copper plate 22, the ceramic substrate 11, the aluminum plate 23, and the heat dissipation plate 42 of the heat sink 41 are bonded, and thus the power module substrate 10 and the power module substrate with a heat sink 40 according to this embodiment are manufactured.

According to the power module substrate 10 according to this embodiment which has the above-described configuration, the circuit layer 12 having the mounting surface 12A on which the semiconductor device 3 is mounted is formed by the first copper plate 22. Accordingly, heat generated from die semiconductor device 3 can sufficiently spread, and thus radiation of heat can be promoted. According to this, an electronic component such as the semiconductor device 3 having high power density can be mounted, and thus a decrease in size and an increase in output of a semiconductor package can be realized.

Prior to bonding, the first copper plate 22 that forms the circuit layer 12 has a composition containing at least either a total of 1 to 100 mol ppm of one or more kinds among an alkaline-earth element, a transition metal element, and a rare-earth element, or 100 to 1000 mol ppm of boron, the remainder being copper and unavoidable impurities, and more preferably, at least either a total of 3 to 50 mol ppm of one or more kinds among an alkaline-earth element, a transition metal element, and a rare-earth element, or 300 to 1000 mol ppm of boron. In this embodiment, Mg-doped copper obtained by adding 15 mol ppm of Mg to oxygen-free copper (OFC) having purity of 99.99% by mass or more is used for the first copper plate 22. Accordingly, Mg reacts with S (sulfur) that is present as one of unavoidable impurities in copper to generate a sulfide, and thus an effect of S can be suppressed. According to this, a recrystallization temperature of the first copper plate 22 (circuit layer 12) is lowered, and thus strain hardening is suppressed. According to this, occurrence of cracking in the ceramic substrate 11 during loading of a cooling and heating cycle can be suppressed.

Further, the content of oxygen in the first copper plate 22 (circuit layer 12) is set to 1 ppm by mass or less. Accordingly, consumption of Mg due to reaction with oxygen is suppressed, and thus Mg and S can be allowed to reliably react with each other.

In addition, in this embodiment, the ceramic substrate 11 is composed of $Al_2O_3$. Accordingly, as described above, the first copper plate 22 and the ceramic substrate 11 can be bonded by a DBC (Direct Bonding Copper) method using a liquid phase in an eutectic range of copper (Cu) and cuprous oxide ($Cu_2O$). According to this, the bonding strength between the ceramic substrate 11 and the circuit layer 12 (first copper plate 22) can be secured, and thus the power module substrate 10 which is excellent in bonding reliability can be constructed.

In addition, any one or more kinds of additive elements among Si, Cu, Ag, Zn, Mg, Ge, Ca, Ga, and Li are contained in the bonding interface 30 between the metal layer 13 and the ceramic substrate 11 and the bonding interface 35 between the metal layer 13 and the heat dissipation plate 42 of the heat sink 41 in a solid solution state, and in this embodiment, as the additive element, Cu is contained in a solid solution state. Accordingly, portions of the metal layer 13 on a bonding interface 30 side and on a bonding interface 35 side are solid-solution-strengthened, and thus a fracture at the portion of the metal layer 13 can be prevented.

In the metal layer 13, the concentration of the additive element (in this embodiment, concentration of Cu) in the vicinity of the bonding interfaces 30 and 35 is set in a range of 0.01 to 5% by mass. Accordingly, the strength of the metal layer 13 in the vicinity of the bonding interfaces 30 and 35 is prevented from excessively increasing, and thus thermal strain during loading of a cooling and heating cycle on the power module substrate 10 can be mitigated by the metal layer 13. As a result, occurrence of cracking in the ceramic substrate 11 can be suppressed.

In addition, the high additive-element concentration portion 32, in which the concentration of any one or more kinds among Si, Cu, Ag, Zn, Mg, Ge, Ca, Ga, and Li (in this embodiment, the concentration of Cu) is set to two or more times the concentration of the additive element in the metal layer 13, is formed at the bonding interface 30 between the metal layer 13 and the ceramic substrate 11. Accordingly, the bonding strength of the metal layer 13 can be improved by the additive element (Cu atom) that is present in the vicinity of the interface.

The heat dissipation plate 42 of the heat sink 41 is composed of a metal material having a proof stress of 100 N/mm$^2$ or more, and the thickness thereof is set to 2 mm or more. In this embodiment, the heat dissipation plate 42 is composed of an A6063 alloy (aluminum alloy). According to this, the heat dissipation plate 42 has high rigidity, and is easy to handle.

Further, the metal layer 13 formed from aluminum (in this embodiment, pure aluminum having purity of 99.99% or more) having a proof stress of 30 N/mm$^2$ or less is provided between the heat dissipation plate 42 of the heat sink 41 and the ceramic substrate 11. Accordingly, even when the rigidity of the heat dissipation plate 42 of the heat sink 41 is high, a thermal strain that is caused by a difference in a coefficient of thermal expansion between the heat dissipation plate 42 of the heat sink 41 and the ceramic substrate 11 can be sufficiently mitigated by the metal layer 13, and thus occurrence of cracking in the ceramic substrate 11 can be suppressed.

In this embodiment, in the first metal layer forming process S02 and the heat sink bonding process S03, the additive element (Cu) diffuses toward the aluminum plate 23 side and the heat dissipation plate 42 side to form the first molten metal region 55 and the second molten metal region 56 at the bonding interfaces 30 and 35, and bonding is carried out by so-called transient liquid phase diffusion bonding in which bonding is realized by solidifying the first molten metal region 55 and the second molten metal region 56. Accordingly, strong bonding can be obtained at a relatively low-temperature condition, and thus the power module substrate 10 and the power module substrate with a heat sink 40, which are excellent in bonding reliability, can be manufactured.

In addition, the amount of the additive element in the first fixation layer 51 and the second fixation layer 52 that are formed in the bonding surfaces of the aluminum plate 23 is set in a range of 0.01 to 10 mg/cm$^2$. In this embodiment, Cu is used as the additive element, and the amount of Cu in the first fixation layer 51 and the second fixation layer 52 is set to 0.08 to 2.7 mg/cm$^2$. Accordingly, the first molten metal region 55 and the second molten metal region 56 can be reliably formed at the bonding interfaces 30 and 35 of the aluminum plate 23. In addition, the additive element (Cu) can be prevented from excessively diffusing toward the aluminum plate 23 side, and the strength of the metal layer 13 (aluminum plate 23) in the vicinity of the bonding interfaces 30 and 35 can be prevented from excessively increasing.

In addition, in this embodiment, the first metal layer forming process S02 and the heat sink bonding process S03 are configured to be carried out simultaneously. Accordingly, the bonding process of both surfaces of the aluminum plate 23 can be carried out by one time, and thus the cost of manufacturing the power module substrate with a heat sink 40 can be greatly reduced. Further, an unnecessary thermal load does not act on the ceramic substrate 11, and thus occurrence of warpage and the like can be suppressed.

In addition, the additive element (Cu) is fixed to the bonding surface of the aluminum plate 23 by sputtering to form the first fixation layer 51 and the second fixation layer 52. Accordingly, the additive element (Cu) can be reliably disposed on the bonding interfaces 30 and 35 of the aluminum plate 23.

Next, a second embodiment of the present invention will be described with reference to FIGS. 9 to 12.

Figure 9:
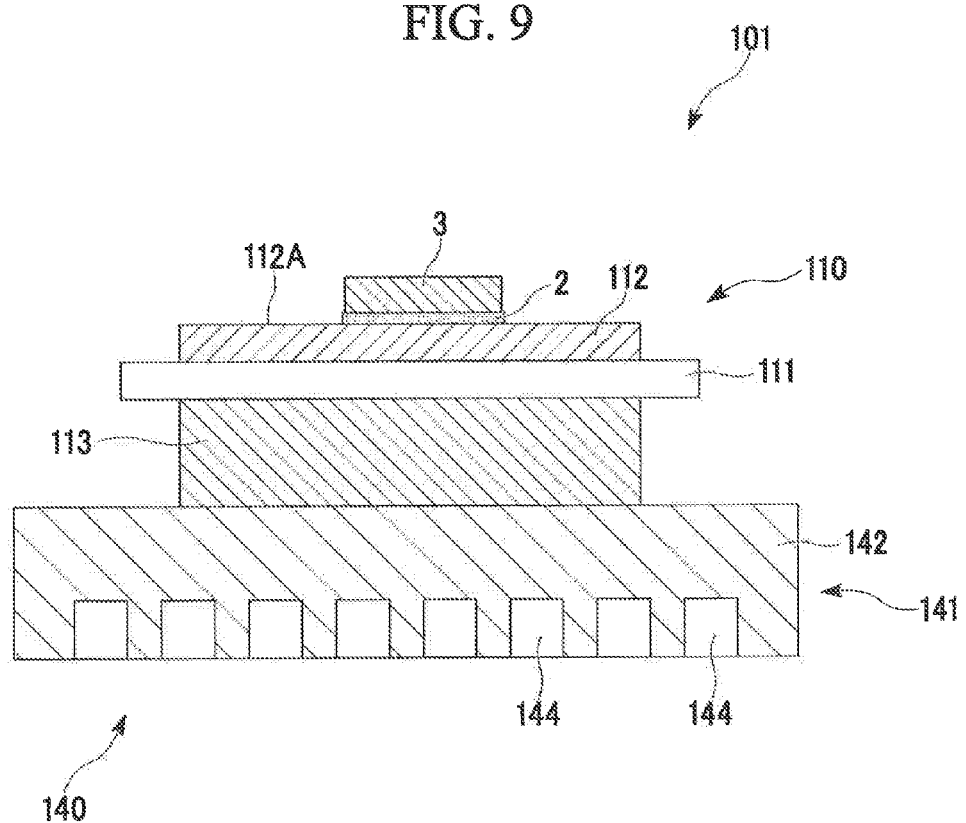
FIG. 9 is a schematic explanatory diagram of a power module substrate and a power module according to a second embodiment of the present invention.
Figure 10:
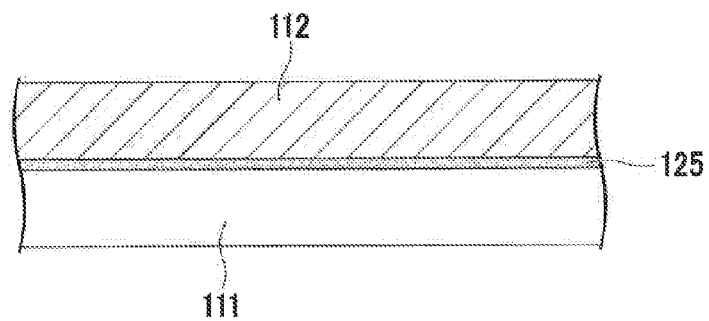
FIG. 10 is an enlarged explanatory diagram of a bonding interface between a circuit layer (copper plate) and a ceramic substrate of the power module substrate according to the second embodiment of the present invention.

A power module 101 shown in FIG. 9 includes a power module substrate 110, a semiconductor device 3, and a heat sink 141. The power module substrate 110 is provided with a circuit layer 112. The semiconductor device 3 is bonded onto a mounting surface 112A of the circuit layer 112 through a solder layer 2.

The power module substrate 110 includes a ceramic substrate 111, the circuit layer 112, and a metal layer 113. The circuit layer 112 is bonded onto one surface (in FIG. 9, the upper surface) of the ceramic substrate 111. The metal layer 113 is bonded onto the other surface (in FIG. 9, the lower surface) of the ceramic substrate 111.

The ceramic substrate 111 is composed of AlN (aluminum nitride) with high insulating properties. In addition, the thickness of the ceramic substrate 111 is set in a range of 0.2 to 1.5 mm, and is set to 0.635 mm in this embodiment.

Figure 12:
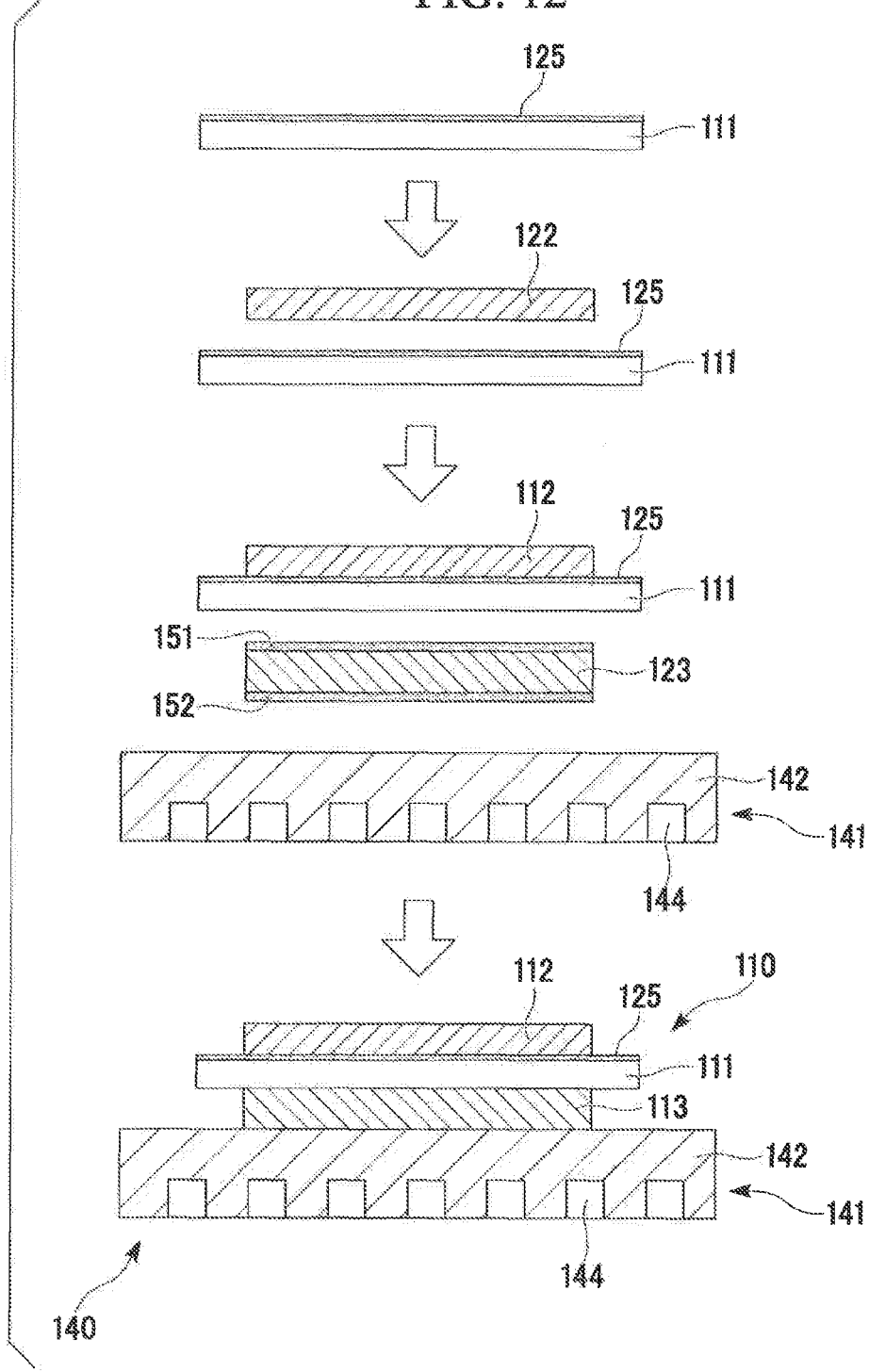
FIG. 12 is an explanatory diagram illustrating the method of manufacturing the power module substrate and the method of manufacturing the power module substrate with a heat sink according to the embodiment of the present invention.

As shown in FIG. 12, the circuit layer 112 is formed by bonding a first copper plate 122 onto one surface of the ceramic substrate 111. The thickness of the circuit layer 112 is set in a range of 0.1 to 1.0 mm, and is set to 0.3 mm in this embodiment.

Prior to bonding, the first copper plate 122 (circuit layer 112) has the same configuration (composition) as that of the first copper plate 22 described in the first embodiment. In this embodiment, Zr-doped copper obtained by adding 10 mol ppm of Zr instead of Mg described in the first embodiment to oxygen-free copper (OFC) having purity of 99.99% by mass or more is used for the first copper plate 122 (circuit layer 112).

As shown in FIG. 12, the metal layer 113 is formed by bonding an aluminum plate 123 onto the other surface of the ceramic substrate 111.

The aluminum plate 123 (metal layer 113) is composed of a rolled plate of aluminum or an aluminum alloy which has purity of 99% by mass or more and a proof stress of 30 N/mm$^2$ or less. In this embodiment, the aluminum plate 123 (the metal layer 113) is composed of a rolled plate of aluminum (so-called 4N aluminum) having a purity of 99.99% by mass or more.

The heat sink 141 is provided with a lop plate portion 142 and a flow channel 144. The top plate portion 142 is a portion of the top plate of the heat sink and is bonded onto the power module substrate 110. A cooling medium (for example, cooling water) flows through the flow channel 144.

The heat sink 141 (top plate portion 142) is preferably composed of a material having satisfactory thermal conductivity, and it is necessary to secure rigidity for a structure material. Therefore, in this embodiment, the top plate portion 142 of the heat sink 141 is composed of A6063 (aluminum alloy).

At a bonding interface between the ceramic substrate 111 and the metal layer 113, any one or more kinds of additive elements among Si, Cu, Ag, Zn, Mg, Ge, Ca, Ga, and Li are contained in a solid solution state. In this embodiment, as the additive element, Ag is contained in a solid solution state.

A concentration gradient layer, in which the concentration of the additive element (in this embodiment, the concentration of Ag) gradually decreases as it is spaced from the bonding interface in a lamination direction, is formed in the vicinity of the bonding interface of the metal layer 113. In addition, the concentration of the additive element (in this embodiment, the concentration of Ag) in the concentration gradient layer on a bonding interface side (the metal layer 113 in the vicinity of the bonding interface) is set in a range of 0.01 to 5% by mass.

The concentration of the additive element in the metal layer 113 in the vicinity of the bonding interface represents an average value obtained by carrying out measurement for five points at a position spaced from the bonding interface by 50 μm using EPMA analysis (spot diameter: 30 μm).

In addition, at the bonding interface between the metal layer 113 and the top plate portion 142, any one or more kinds of additive elements among Si, Cu, Ag, Zn, Mg, Ge, Ca, Ga, and Li are contained in the metal layer 113 and the top plate portion 142 in a solid solution state. In this embodiment, as the additive element, Ag is contained in a solid solution state.

A concentration gradient layer, in which the concentration of the additive element (in this embodiment, the concentration of Ag) gradually decreases as it is spaced from the bonding interface in a lamination direction, is formed in the vicinity of the bonding interface between the metal layer 113 and the top plate portion 142. In addition, the concentration of the additive element (in this embodiment, the concentration of Ag) in the concentration gradient layer on a bonding interface side (in the vicinity of the bonding interface between the metal layer 113 and the top plate portion 142) is set in a range of 0.01 to 5% by mass. The concentration of the additive element in the vicinity of the bonding interface between the metal layer 113 and the top plate portion 142 represents an average value obtained by carrying out measurement for five points at a position spaced from the bonding interface by 50 μm using EPMA analysis (spot diameter: 30 μm).

In addition, in a case of observing the bonding interface between the ceramic substrate 111 and the metal layer 113 using a transmission electron microscope, a high additive-element concentration portion in which the additive element (Ag) is concentrated is formed at the bonding interface. In the high additive-element concentration portion, the concentration of the additive element (concentration of Ag) is set to two or more times the concentration of the additive element (concentration of Ag) in the metal layer 113. The thickness H of the high additive-element concentration portion is set to 4 nm or less.

Here, in the bonding interface that is observed, the center between an end of the metal layer 113 on a lattice-shaped interface side and an end of the ceramic substrate 111 on a lattice-shaped bonding interface side is set as a reference plane. In addition, the concentration of the additive element (concentration of Ag) in the metal layer 113 represents a concentration of the additive element (concentration of Ag) in the metal layer 113 at a portion of which is spaced from the bonding interface by a constant distance (in this embodiment, 5 nm).

Hereinafter, a method of manufacturing the power module substrate 110 and a power module substrate with a heat sink 140, which have the above-described configuration, will be described.

Figure 11:
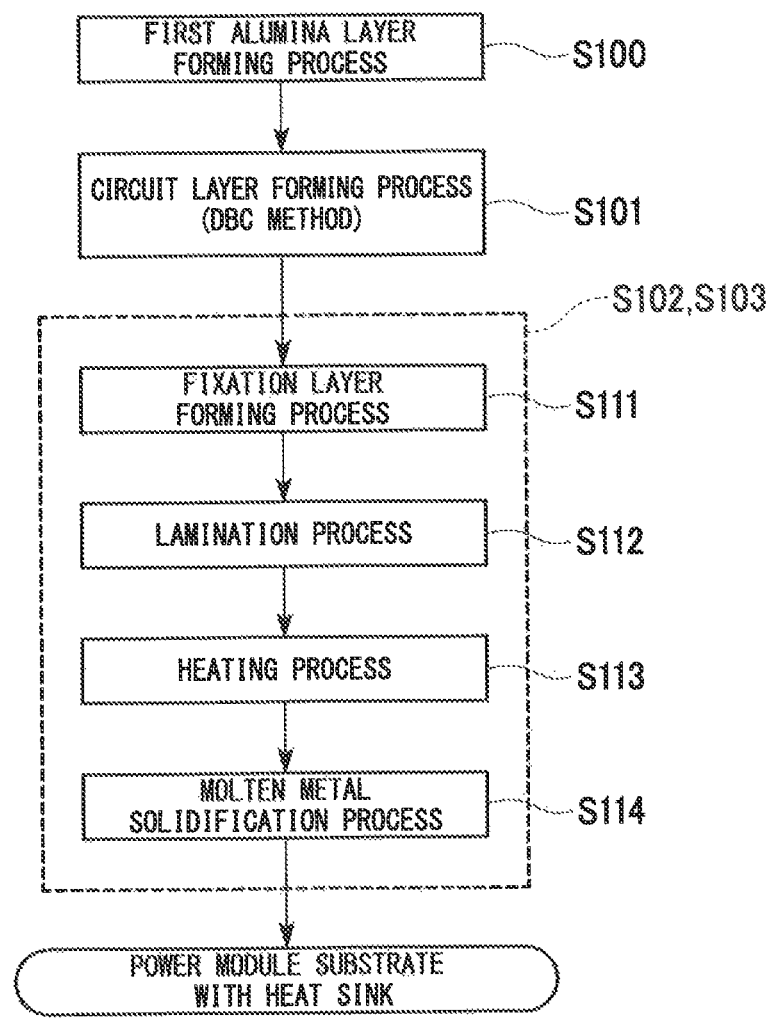
FIG. 11 is a flow chart illustrating a method of manufacturing the power module substrate and a method of manufacturing a power module substrate with a heat sink according to an embodiment of the present invention.

First, as shown in FIGS. 11 and 12, an $Al_2O_3$ layer 125 is formed on a surface of the ceramic substrate 111 formed from AlN (first alumina layer forming process S100). In the first alumina layer forming process S100, an AlN oxidizing treatment is carried out at 1200° C. or higher in an Ar—$O_2$ mixed gas atmosphere. An oxygen partial pressure $P_{O2}$ is set to 10 kPa, and a water-vapor partial pressure $P_{H2O}$ is adjusted to 0.05 kPa. In this manner, the AlN oxidizing treatment is carried out in the atmosphere of high-oxygen partial pressure and low-water-vapor partial pressure, and thus a dense $Al_2O_3$ layer 125 excellent in adhesiveness with AlN is formed. The thickness of the $Al_2O_3$ layer 125 is set to 1 μm or more.

The oxygen partial pressure is adjusted by deoxidizing a high-purity Ar gas and then by mixing an oxygen gas into the Ar gas. In addition, the water-vapor partial pressure is adjusted by carrying out a dehydration treatment by allowing this atmospheric gas to pass through a dry system in which silica gel and diphosphorous pentaoxide are filled, and then by allowing the atmospheric gas to pass through water adjusted to a predetermined temperature.

Next, the first copper plate 122 serving as the circuit layer 112 and the ceramic substrate 111 are bonded to each other (a circuit layer forming process S101). The $Al_2O_3$ layer 125 is formed on one surface of the ceramic substrate 111 formed from AlN, the first copper plate 122 and the $Al_2O_3$ layer 125 are bonded by a DBC (Direct Bonding Copper) method using a liquid phase in an eutectic range of copper (Cu) and cuprous oxide ($Cu_2O$). Specifically, the first copper plate 122 and the $Al_2O_3$ layer 125 are brought into contact with each other, and the first copper plate 122 and the $Al_2O_3$ layer 125 are bonded by carrying out heating at 1075° C. for 10 minutes in a nitrogen gas atmosphere.

Next, the aluminum plate 123 serving as the metal layer 113 is bonded onto the other surface side of the ceramic substrate 111 (first metal layer forming process S102), and the aluminum plate 123 and the heat sink 141 (the top plate portion 142) are bonded to each other (heat sink bonding process S103). In this embodiment, the first metal layer forming process S102 and the heat sink bonding process S103 are carried out simultaneously.

The additive element is fixed to one surface of the aluminum plate 123 by sputtering to form a first fixation layer 151, and the additive element is fixed to the other surface of the aluminum plate 123 by sputtering to form a second fixation layer 152 (fixation layer forming process S111). An amount of the additive element in the first fixation layer 151 and the second fixation layer 152 is set in a range of 0.01 to 10 mg/cm². In this embodiment, Ag is used as the additive element, and the amount of Ag in the first fixation layer 151 and the second fixation layer 152 is set to 0.01 to 10 mg/cm².

Next, as shown in FIG. 12, the aluminum plate 123 is laminated on the other surface side of the ceramic substrate 111. Further, the top plate portion 142 is laminated on the other surface side of the aluminum plate 123 (lamination process S112).

At this time, as shown in FIG. 12, the ceramic substrate 111, the aluminum plate 123, and the top plate portion 142 are laminated in such a manner that the surface of the aluminum plate 123 on which the first fixation layer 151 is formed faces the ceramic substrate 111, and the surface of the aluminum plate 123 on which the second fixation layer 152 is formed faces the top plate portion 142. That is, the first fixation layer 151 (additive element: Ag) is interposed between the aluminum plate 123 and the ceramic substrate 111, and the second fixation layer 152 (additive element: Ag) is interposed between the aluminum plate 123 and the top plate portion 142.

Next, the first copper plate 122, the ceramic substrate 111, the aluminum plate 123, and the top plate portion 142 are put into a vacuum heating furnace and are heated therein in a state in which these are compressed in a lamination direction (heating process S113). In this embodiment, a pressure inside the vacuum heating furnace is set in a range of $10^{-3}$ to $10^{-6}$ Pa, and a heating temperature is set in a range of 550 to 650° C.

According to this process, a first molten metal region is formed at an interface between the aluminum plate 123 and the ceramic substrate 111. The additive element (Ag) of the first fixation layer 151 diffuses toward the aluminum plate 123 side, and thus the concentration of the additive element (concentration of Ag) of the aluminum plate 123 in the vicinity of the first fixation layer 151 increases, and a melting point is lowered, whereby the first molten metal region is formed.

In addition, a second molten metal region is formed at an interface between the aluminum plate 123 and the top plate portion 142. The additive element (Ag) of the second fixation layer 152 diffuses toward the aluminum plate 123 side and the top plate portion 142 side, and thus the concentration of the additive element (concentration of Ag) in the aluminum plate 123 and the top plate portion 142 in the vicinity of the second fixation layer 152 increases, and a melting point is lowered, whereby the second molten metal region is formed.

Next, a temperature is constantly retained in a state in which the first molten metal region and the second molten metal region are formed (molten metal solidification process S114).

According to this process, Ag in the first molten metal region further diffuses toward the aluminum plate 123 side. According to this, the concentration of Ag at a portion that is the first molten metal region gradually decreases, and a melting point thereof is raised, and thus solidification progresses in a state in which a temperature is constantly retained. According to this, the ceramic substrate 111 and the aluminum plate 123 are bonded.

Similarly, Ag in the second molten metal region further diffuses toward the aluminum plate 123 side and the top plate portion 142 side. According to this, the concentration of Ag at a portion that is the second molten metal region gradually decreases, and a melting point thereof is raised, and thus solidification progresses in a state in which a temperature is constantly retained. According to this, the aluminum plate 123 and the top plate portion 142 are bonded.

That is, the ceramic substrate 111 and the aluminum plate 123, and the aluminum plate 123 and the top plate portion 142 are bonded, respectively, by so-called transient liquid phase diffusion bonding. In this manner, after the solidification progresses, cooling is carried out to room temperature.

In this manner, the first copper plate 122, the ceramic substrate 111, the aluminum plate 123, and the heat sink 141 (top plate portion 142) are bonded, and thus the power module substrate 110 and the power module substrate with a heat sink 140 according to this embodiment are manufactured.

According to the power module substrate 110 according to this embodiment which has the above-described configuration, the circuit layer 112 is formed by the first copper plate 122. Accordingly, radiation of heat transferred from a heat generation body such as the semiconductor device 3 that is mounted on the mounting surface 112A of the circuit layer 112 can be efficiently promoted.

In addition, the circuit layer 112 is formed by the first copper plate 122 containing 10 mol ppm of Zr. Accordingly, Zr reacts with S (sulfur) that is present as one of unavoidable impurities in copper to generate a sulfide, and thus an effect of S can be suppressed. According to this, a recrystallization temperature of the first copper plate 122 (circuit layer 112) is lowered, and thus strain hardening is suppressed. According to this, occurrence of cracking in the ceramic substrate 111 during loading of a cooling and heating cycle can be suppressed.

In addition, in this embodiment, since the $Al_2O_3$ layer 125 is formed on the surface of the ceramic substrate 111 formed from AlN, and the first copper plate 122 and the ceramic substrate 111 are bonded to each other using the $Al_2O_3$ layer 125 according to the DBC method, the first copper plate 122 and the ceramic substrate 111 can be strongly bonded. In this manner, even in the ceramic substrate 111 formed from AlN, bonding of the first copper plate 122 by using the DBC method is possible.

Further, in the first alumina layer forming process S100, the thickness of the $Al_2O_3$ layer 125 that is formed is set to 1 μm or more. Accordingly, the first copper plate 122 and the ceramic substrate 111 can be reliably bonded to each other.

In addition, in this embodiment, since the AlN oxidizing treatment is carried out in the atmosphere of high-oxygen partial pressure and low-water-vapor partial pressure, and thus the dense $Al_2O_3$ layer 125 excellent in adhesiveness with AlN is formed. Accordingly, occurrence of peeling between the ceramic substrate 111 formed from AlN and the $Al_2O_3$ layer 125 can be prevented.

Next, a third embodiment of the present invention will be described with reference to FIGS. 13 to 15.

Figure 13:
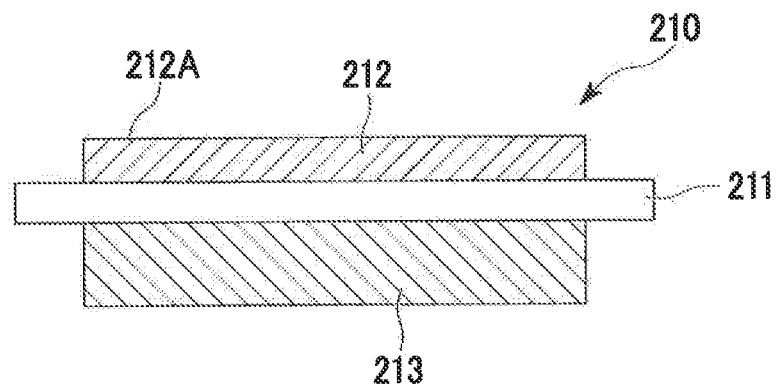
FIG. 13 is a schematic explanatory diagram of a power module substrate according to a third embodiment of the present invention.

A power module substrate 210 which is shown in FIG. 13 includes a ceramic substrate 211, a circuit layer 212, and a metal layer 213. The circuit layer 212 is formed on one surface (the upper surface in FIG. 13) of the ceramic substrate 211. The metal layer 213 is formed on the other surface (in FIG. 13, the lower surface) of the ceramic substrate 211.

The ceramic substrate 211 prevents electrical connection between the circuit layer 212 and the metal layer 213, and is composed of AlN with high insulating properties. In addition, the thickness of the ceramic substrate 211 is set in a range of 0.2 to 1.5 mm, and is set to 0.635 mm in this embodiment.

Figure 15:
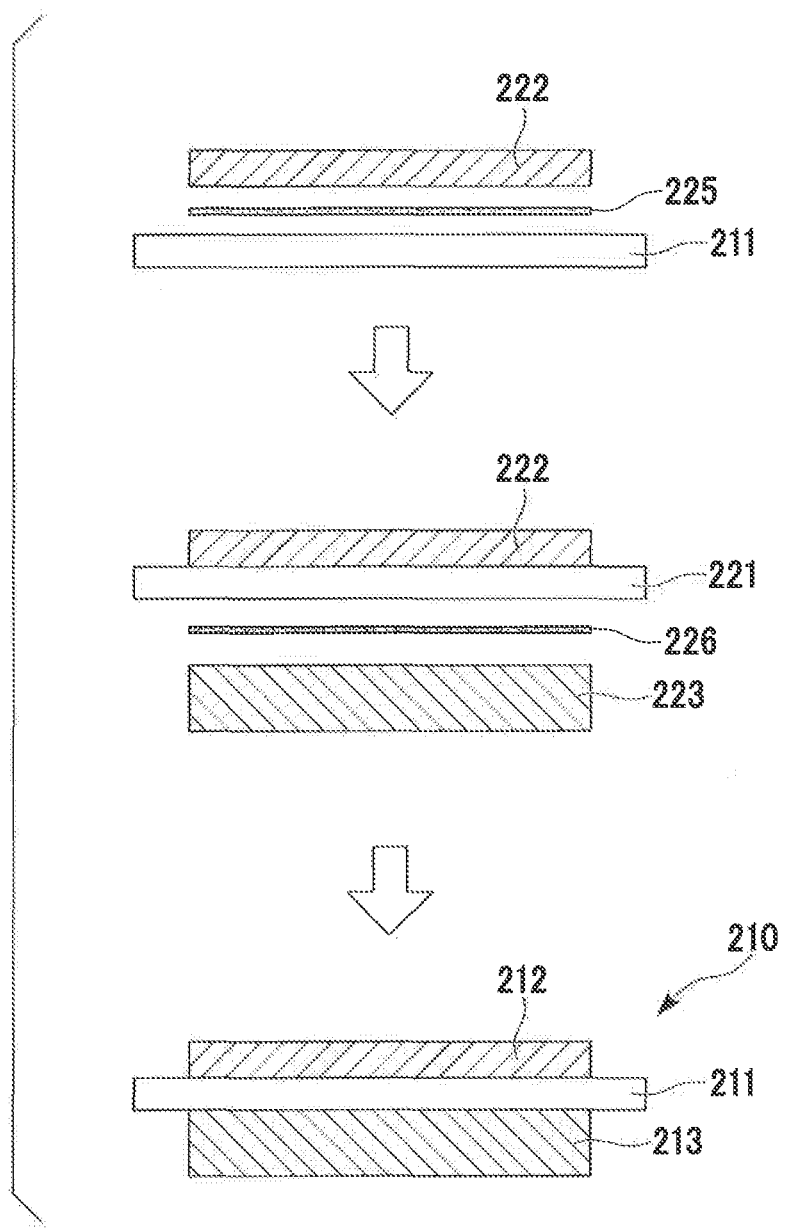
FIG. 15 is an explanatory diagram illustrating the method of manufacturing the power module substrate according to the third embodiment of the present invention.

As shown in FIG. 15, the circuit layer 212 is formed by bonding a first copper plate 222 onto one surface (in FIG. 15, the upper surface) of the ceramic substrate 211. The thickness of the circuit layer 212 is set in a range of 0.1 to 1.0 mm, and is set to 0.3 mm in this embodiment. In addition, a circuit pattern is formed in the circuit layer 212, and one surface (in FIG. 13, the upper surface) is set as a mounting surface 212A on which the semiconductor device 3 is mounted.

Prior to bonding, the first copper plate 222 (circuit layer 212) contains at least either a total of 1 to 100 mol ppm of one or more kinds among an alkaline-earth element, a transition metal element, and a rare-earth element, or 100 to 1000 mol ppm of boron, the remainder being copper and unavoidable impurities, and more preferably, at least either a total of 3 to 50 mol ppm of one or more kinds among an alkaline-earth element, a transition metal element, and a rare-earth element, or 300 to 1000 mol ppm of boron. The content of oxygen is set to 1 ppm by mass or less.

In this embodiment, La-doped copper obtained by adding 7 mol ppm of La to oxygen-free copper (OFC) having purity of 99.99% by mass or more is used for the first copper plate 222 (circuit layer 212).

As shown in FIG. 15, the metal layer 213 is formed by bonding an aluminum plate 223 onto the other surface (in FIG. 15, the lower surface) of the ceramic substrate 211.

The aluminum plate 223 (metal layer 213) is composed of a rolled plate of aluminum or an aluminum alloy which has purity of 99% by mass or more and a proof stress of 30 N/mm² or less.

In this embodiment, the aluminum plate 223 (the metal layer 213) is composed of a rolled plate of aluminum (so-called 4N aluminum) having purity of 99.99% by mass or more).

Hereinafter, a method of manufacturing the power module substrate 210, which has the above-described configuration, will be described.

Figure 14:
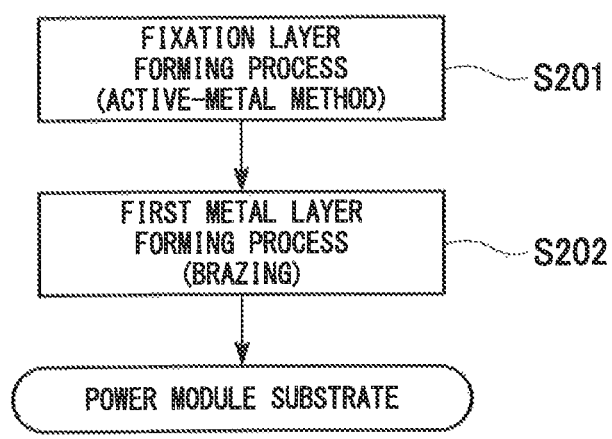
FIG. 14 is a flow chart of a method of manufacturing the power module substrate according to the third embodiment of the present invention.

First, as shown in FIGS. 14 and 15, the first copper plate 222 serving as the circuit layer 212 and the ceramic substrate 211 are bonded to each other (a circuit layer forming process S201). The ceramic substrate 211 and the first copper plate 222 are bonded according to a so-called active-metal method. As shown in FIG. 15, the active-metal method is a method in which a brazing material 225 formed from Ag—Cu—Ti is provided between the ceramic substrate 211 and the first copper plate 222 to bond the ceramic substrate 211 and the first copper plate 222.

In this embodiment, the brazing material 225 formed from Ag-27.4% by mass of Cu-2.0% by mass of Ti is used, and heating is carried out in vacuum of $10^{-3}$ Pa at 850° C. for 10 minutes in a compressed state in a lamination direction, whereby the ceramic substrate 211 and the first copper plate 222 are bonded to each other.

Next, the aluminum plate 223 serving as the metal layer 213 is bonded onto the other surface side of the ceramic substrate 211 (first metal layer forming process S202). The ceramic substrate 211 and the aluminum plate 223 are bonded to each other using an Al—Si-based brazing material.

As shown in FIG. 15, in this embodiment, brazing material foil 226 having a thickness of 15 to 30 μm (in this embodiment, 20 μm) is provided between the ceramic substrate 211 and the aluminum plate 223, these are put into a heating furnace of a $N_2$ gas atmosphere in a compressed state in a lamination direction and are heated at a temperature in a range of 550 to 650° C., whereby the aluminum plate 223 and the ceramic substrate 211 are bonded to each other.

In this manner, the first copper plate 222, the ceramic substrate 211, and the aluminum plate 223 are bonded, and thus the power module substrate 210 according to this embodiment is manufactured.

According to the power module substrate 210 according to this embodiment which has the above-described configuration, the circuit layer 212 is formed by the first copper plate 222. Accordingly, radiation of heat transferred from a heat generation body such as the semiconductor device that is mounted on the mounting surface 212A of the circuit layer 212 can be efficiently promoted.

In addition, the circuit layer 212 is formed by the first copper plate 222 containing 7 mol ppm of La. Accordingly, La reacts with S (sulfur) that is present as one of unavoidable impurities in copper to generate a sulfide, and thus an effect of S can be suppressed. According to this, a recrystallization temperature of the first copper plate 222 (circuit layer 212) is lowered, and thus strain hardening is suppressed. According to this, occurrence of cracking in the ceramic substrate 211 during loading of a cooling and heating cycle can be suppressed.

In addition, the first copper plate 222 and the ceramic substrate 211 are bonded to each other according to the active-metal method using the brazing material 225 of Ag—Cu—Ti. Accordingly, the power module substrate 210 can be configured without interposing oxygen at the interface between the first copper plate 222 and the ceramic substrate 211.

Next, a fourth embodiment of the present invention will be described with reference to FIG. 16.

Figure 16:
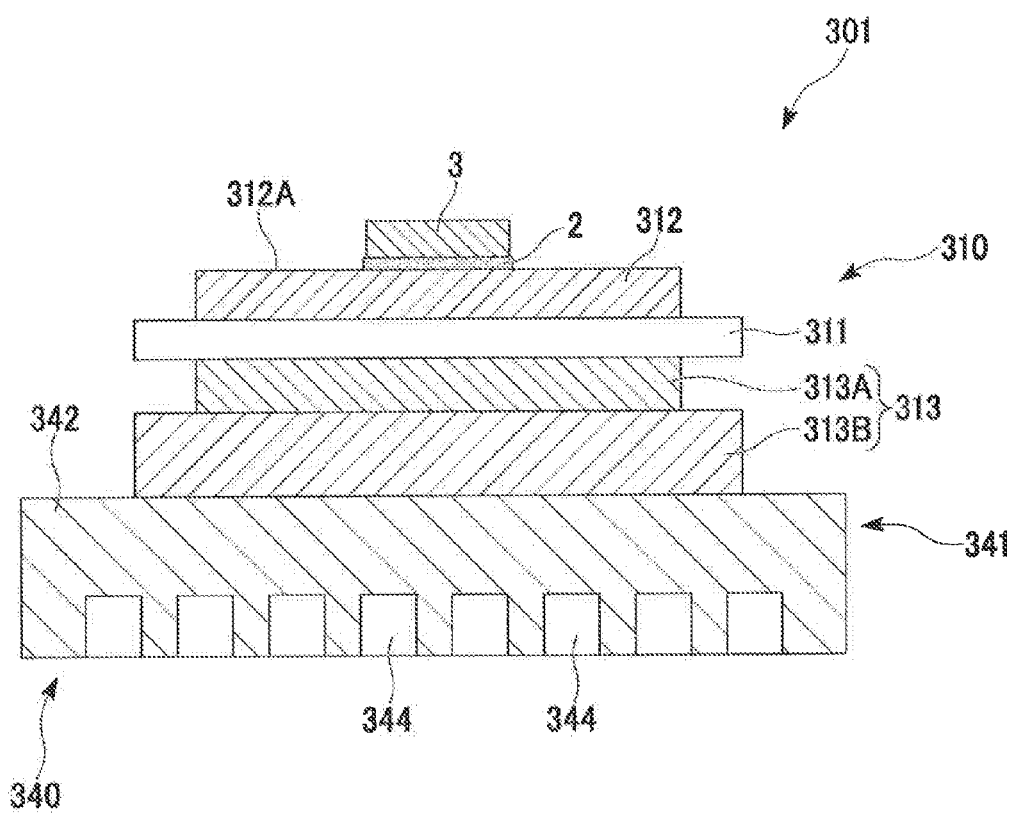
FIG. 16 is a schematic explanatory diagram of a power module substrate and a power module according to a fourth embodiment of the present invention.

As shown in FIG. 16, a metal layer 313 may have a structure in which a plurality of aluminum plates 313A and 313B are laminated. In FIG. 16, two aluminum plates 313A and 313B are laminated, but the number of lamination plates is not limited. In addition, as shown in FIG. 16, the aluminum plates that are laminated may have different size and shape, or the aluminum plates may be adjusted to have the same size and the same shape. Further, the metal plates may be different in a composition.

Figure 17:
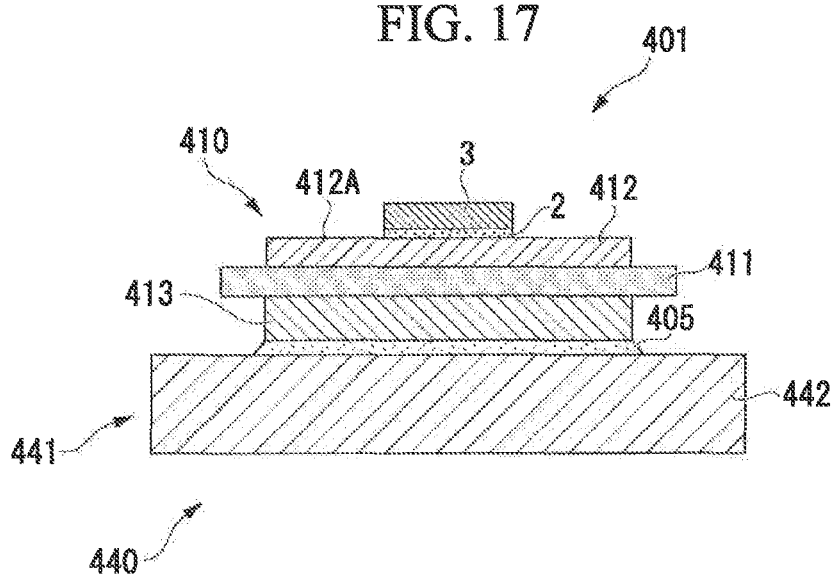
FIG. 17 is a schematic explanatory diagram of a power module substrate and a power module according to a fifth embodiment of the present invention.

FIG. 17 illustrates a power module substrate 410, a power module substrate with a heat sink 440, and a power module 401 according to a fifth embodiment of the present invention.

The power module 401 includes the power module substrate 410, a semiconductor device 3, and a heat sink 441. The power module substrate 410 is provided with a circuit layer 412. The semiconductor device 3 is bonded onto a mounting surface 412A of the circuit layer 412 through a solder layer 2. For example, the solder layer 2 is formed from a Sn—Ag-based, Sn—In-based, or Sn—Ag—Cu-based solder material (so-called lead-free solder material). In this embodiment, a Ni-plated film (not shown) may be provided between the mounting surface 412A of the circuit layer 412 and the solder layer 2.

As shown in FIG. 17, the power module substrate 410 includes a ceramic substrate 411, the circuit layer 412, and a metal layer 413. The circuit layer 412 is formed on one surface (in FIG. 17, the upper surface) of the ceramic substrate 411. The metal layer 413 is formed on the other surface (in FIG. 17, the lower surface) of the ceramic substrate 411.

The ceramic substrate 411 prevents electrical connection between the circuit layer 412 and the metal layer 413, and is composed of $Al_2O_3$ (alumina) with high insulating properties. In addition, the thickness of the ceramic substrate 411 is set in a range of 0.2 to 1.5 mm, and is set to 0.635 mm in this embodiment.

Figure 19:
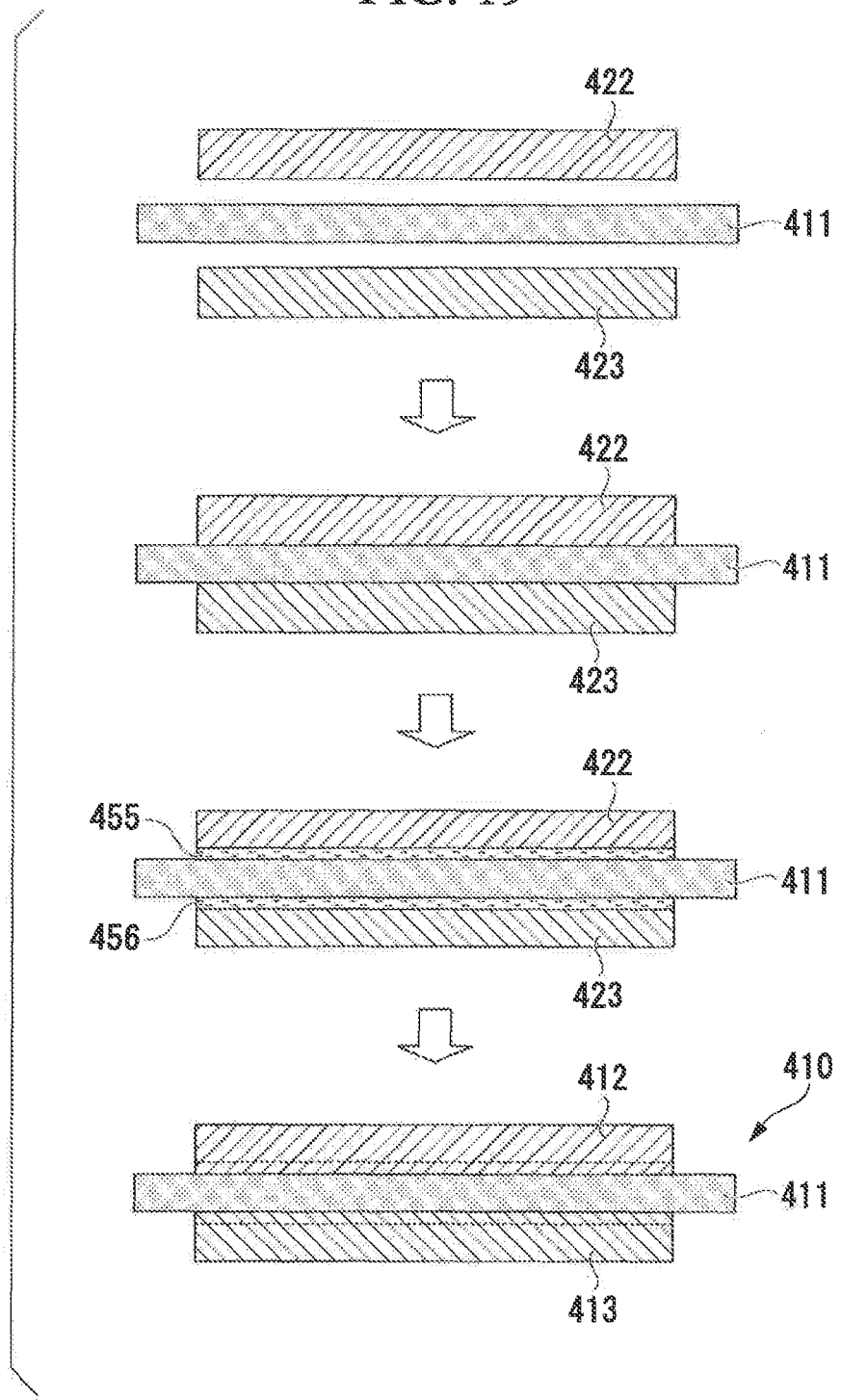
FIG. 19 is an explanatory diagram illustrating the method of manufacturing the power module substrate according to the fifth embodiment of the present invention.

As shown in FIG. 19, the circuit layer 412 is formed by bonding a first copper plate 422 onto one surface (in FIG. 19, the upper surface) of the ceramic substrate 411. The thickness of the circuit layer 412 is set in a range of 0.1 to 1.0 mm, and is set to 0.3 mm in this embodiment. In addition, a circuit pattern is formed in the circuit layer 412, and one surface (in FIG. 17, the upper surface) is set as the mounting surface 412A on which the semiconductor device 3 is mounted.

As shown in FIG. 19, the metal layer 413 is formed by bonding a second copper plate 423 onto the other surface (in FIG. 19, the lower surface) of the ceramic substrate 411. The thickness of the metal layer 413 is set in a range of 0.1 to 1.0 mm, and is set to 0.3 mm in this embodiment.

Prior to bonding, all of the first copper plate 422 (circuit layer 412) and the second copper plate 423 (metal layer 413) have the same configuration (composition) as that of the first copper plate 22 described in the first embodiment. In this embodiment, Mg-doped copper obtained by adding 15 mol ppm of Mg to oxygen-free copper (OFC) having purity of 99.99% by mass or more is used for the first copper plate 422 (circuit layer 412) and the second copper plate 423 (metal layer 413).

A heat sink 441 cools down the above-described power module substrate 410. As shown in FIG. 17, the heat sink 441 according to this embodiment includes a heat dissipation plate 442 that is bonded to the other surface side of the metal layer 413 of the power module substrate 410. In this embodiment, the heat dissipation plate 442 is composed of an A6063 alloy (aluminum alloy).

The metal layer 413 of the power module substrate 410 and a top plate portion of the heat dissipation plate 442 of the heat sink 441 are bonded to each other through a solder layer 405. For example, the solder layer 405 is formed from a Sn—Ag-based, Sn—In-based, or Sn—Ag—Cu-based solder material (so-called lead-free solder material). In this embodiment, the top plate portion of the heat dissipation plate 442 is bonded onto the other surface of the metal layer 413. However, there is no particular limitation thereto, and the heat dissipation plate 442 can be directly brazed to the other surface (in FIG. 19, the lower surface) of the ceramic substrate 411.

Hereinafter, a method of manufacturing the power module substrate 410 and a method of manufacturing the power module substrate with a heat sink 440 which have the above-described configuration will be described with reference to FIGS. 18 and 19.

Figure 18:
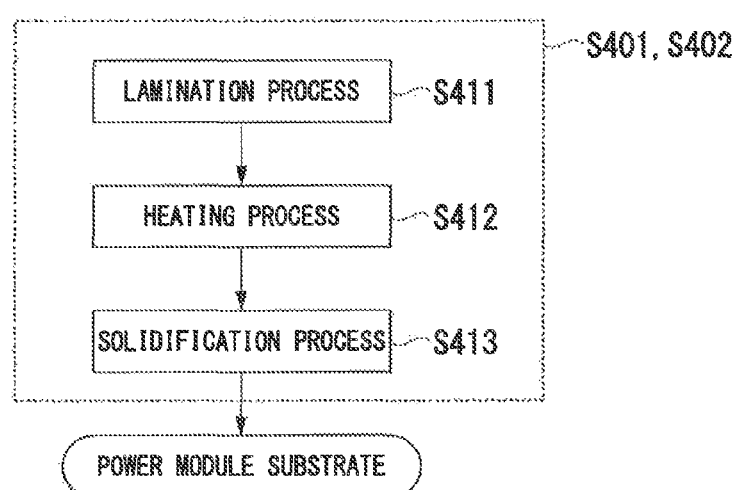
FIG. 18 is a flow chart of a method of manufacturing the power module substrate according to the fifth embodiment of the present invention.

As shown in FIGS. 18 and 19, the first copper plate 422 serving as the circuit layer 412 and the ceramic substrate 411 are bonded to each other (circuit layer forming process S401), and the second copper plate 423 serving as the metal layer 413 and the ceramic substrate 411 are bonded to each other (second metal layer forming process S402). In this embodiment the circuit layer forming process S401 and the second metal layer forming process S402 are carried out simultaneously.

First, the first copper plate 422 is laminated on one surface side of the ceramic substrate 411. In addition, the second copper plate 423 is laminated on the other surface side of the ceramic substrate 411 (lamination process S41).

Next, the first copper plate 422, the ceramic substrate 411, and the second copper plate 423 are heated in an oxygen-containing atmosphere in a compressed state in a lamination direction (heating process S412). In this embodiment, the heating temperature is set in a range of 1065 to 1083° C.

According to this process, as shown in FIG. 19, a first molten metal region 455 is formed at an interface between the first copper plate 422 and the ceramic substrate 411, and a second molten metal region 456 is formed at an interface between the ceramic substrate 411 and the second copper plate 423. These first molten metal region 455 and the second molten metal region 456 are formed when a melting point is lowered due to a eutectic reaction between copper (Cu) and cuprous oxide ($Cu_2O$).

Next, a temperature is lowered to solidify the first molten metal region 455 and the second molten metal region 456 (solidification process S413).

In this manner, the first copper plate 422, the ceramic substrate 411, and the second copper plate 423 are bonded, whereby the power module substrate 410 according to this embodiment is manufactured.

According to the power module substrate 410 of this embodiment which has the above-described configuration, the circuit layer 412 having the mounting surface 412A on which the semiconductor device 3 is mounted is formed by the first copper plate 422. Accordingly, heat generated from the semiconductor device 3 can sufficiently spread, and thus radiation of the heat can be promoted. According to this, an electronic component such as the semiconductor device 3 having high power density can be mounted, and thus a decrease in size and an increase in output of a semiconductor package can be realized.

Prior to bonding, all of the first copper plate 422 that forms the circuit layer 412 and the second copper plate 423 that forms the metal layer 413 has the same configuration (composition) as that of the first copper plate 22 described in the first embodiment. In this embodiment, Mg-doped copper obtained by adding 15 mol ppm of Mg to oxygen-free copper (OFC) having purity of 99.99% by mass or more is used for the first copper plate 422 and the second copper plate 423. Accordingly, Mg reacts with S (sulfur) that is present as one of unavoidable impurities in copper to generate a sulfide, and thus an effect of S can be suppressed. According to this, a recrystallization temperature of the first copper plate 422 (circuit layer 412) and the second copper plate 423 (metal layer 413) is lowered, and thus strain hardening is suppressed. According to this, occurrence of cracking in the ceramic substrate 411 during loading of a cooling and heating cycle can be suppressed.

Further, the content of oxygen in the first copper plate 422 (circuit layer 412) and the second copper plate 423 (metal layer 413) is set to 1 ppm by mass or less. Accordingly, consumption of Mg due to reaction with oxygen is suppressed, and thus Mg and S may be allowed to reliably react with each other.

In addition, in this embodiment, the ceramic substrate 411 is composed of $Al_2O_3$. Accordingly, as described above, the first and second copper plates 422 and 423 and the ceramic substrate 411 may be bonded by a DBC (Direct Bonding Copper) method using a liquid phase in an eutectic range of copper (Cu) and cuprous oxide ($Cu_2O$). According to this, bonding strength between the ceramic substrate 411 and the circuit layer 412 (first copper plate 422) and bonding strength between the ceramic substrate 411 and the metal layer 413 (second copper plate 423) may be secured, and thus the power module substrate 410 which is excellent in bonding reliability may be constructed.

In addition, in this embodiment, the circuit layer forming process S401 and the second metal layer forming process S402 are configured to be carried out simultaneously. Accordingly, occurrence of warpage in the ceramic substrate 411 during bonding may be suppressed. In addition, an unnecessary thermal load does not act on the ceramic substrate 411, and thus occurrence of warpage and the like may be suppressed. Further, the cost of manufacturing the power module substrate 410 may be greatly reduced.

Next, a sixth embodiment of the present invention will be described with reference to FIGS. 20 to 22.

Figure 20:
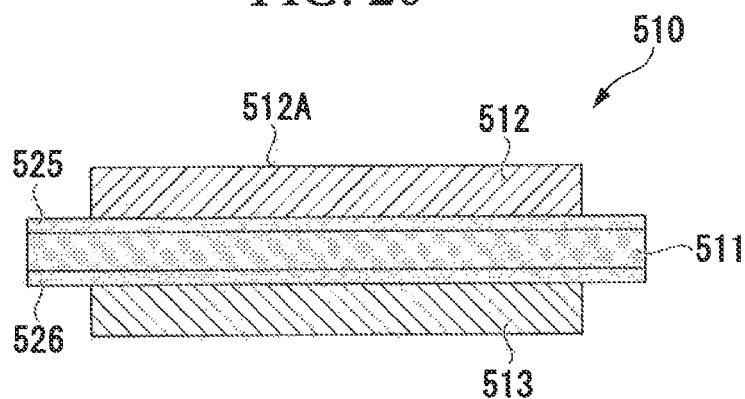
FIG. 20 is a schematic explanatory diagram of a power module substrate according to a sixth embodiment of the present invention.

A power module substrate 510 which is shown in FIG. 20 includes a ceramic substrate 511, a circuit layer 512, and a metal layer 513. The circuit layer 512 is bonded onto one surface (in FIG. 20, the upper surface) of the ceramic substrate 511. The metal layer 513 is bonded onto the other surface (in FIG. 20, the lower surface) of the ceramic substrate 511.

The ceramic substrate 511 is composed of AlN (aluminum nitride) with high insulating properties. In addition, the thickness of the ceramic substrate 511 is set in a range of 0.2 to 1.5 mm, and is set to 0.635 mm in this embodiment.

In addition, $Al_2O_3$ layers 525 and 526 are formed on one surface and the other surface of the ceramic substrate 511.

Figure 22:
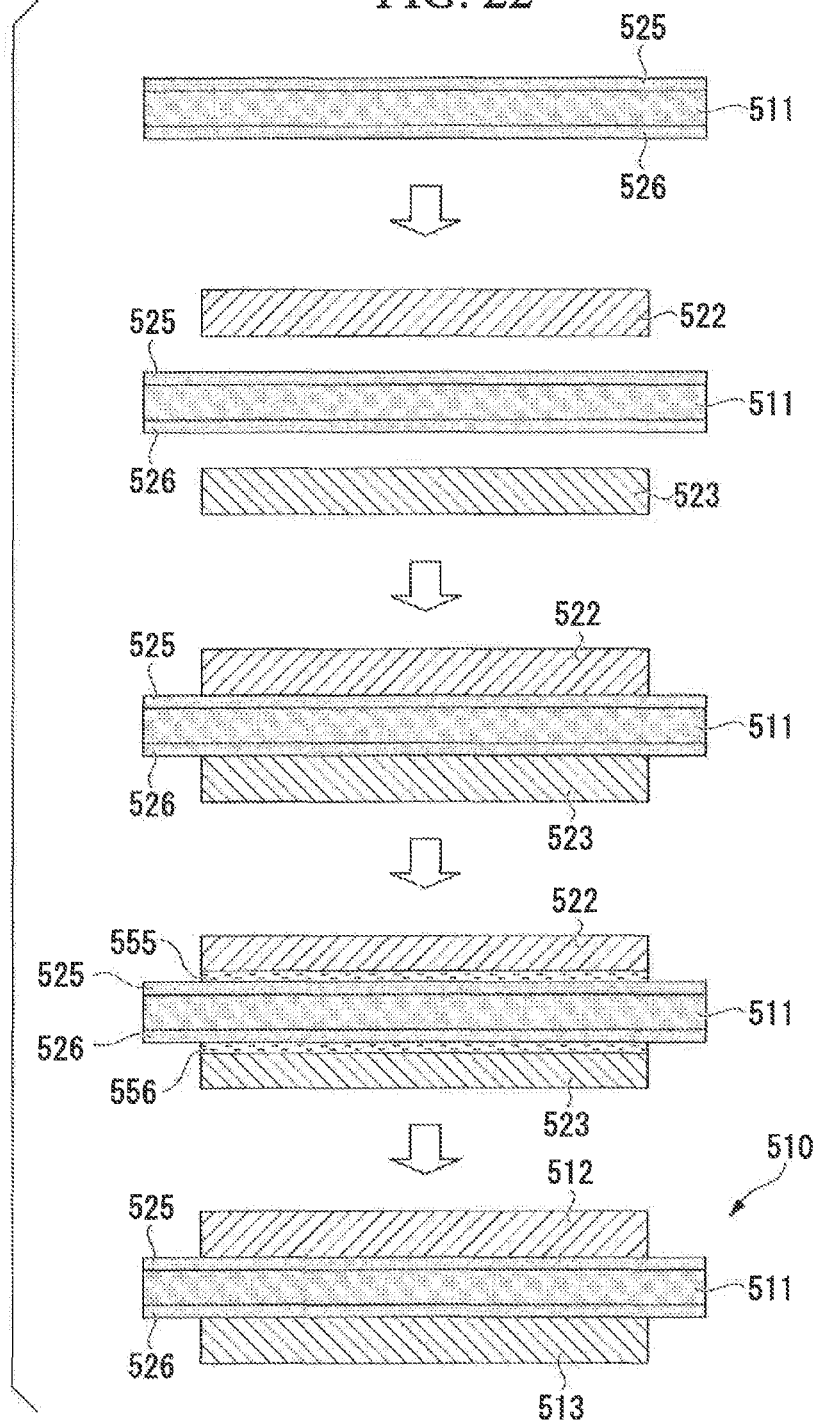
FIG. 22 is an explanatory diagram illustrating the method of manufacturing the power module substrate according to the sixth embodiment of the present invention.

As shown in FIG. 22, the circuit layer 512 is formed by bonding a first copper plate 522 onto one surface (in FIG. 22, the upper surface) of the ceramic substrate 511. The thickness of the circuit layer 512 is set in a range of 0.1 to 1.0 mm, and is set to 0.3 mm in this embodiment. A circuit pattern is formed in the circuit layer 512, and one surface (in FIG. 20, the upper surface) is set as a mounting surface 512A on which an electronic component such as a semiconductor device is mounted.

As shown in FIG. 22, the metal layer 513 is formed by bonding a second copper plate 523 onto the other surface (in FIG. 22, the lower surface) of the ceramic substrate 511. The thickness of the metal layer 513 is set in a range of 0.1 to 1.0 mm, and is set to 0.3 mm in this embodiment.

Prior to bonding, all of the first copper plate 522 (circuit layer 512) and the second copper plate 523 (metal layer 513) have the same configuration (composition) as that of the first copper plate 22 described in the first embodiment. In this embodiment, Zr-doped copper obtained by adding 10 mol ppm of Zr instead of Mg described in the first embodiment to oxygen-free copper (OFC) having purity of 99.99% by mass or more is used for the first copper plate 522 (circuit layer 512) and the second copper plate 523 (metal layer 513).

Hereinafter, a method of manufacturing the power module substrate 510 which has the above-described configuration will be described with reference to FIGS. 21 and 22.

Figure 21:
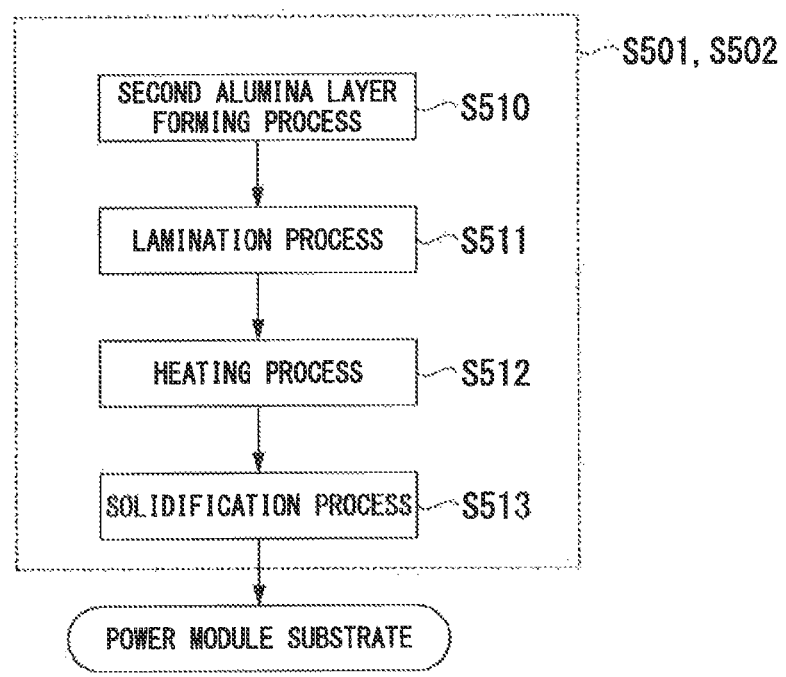
FIG. 21 is a flow chart of a method of manufacturing the power module substrate according to the sixth embodiment of the present invention.

As shown in FIGS. 21 and 22, in this embodiment, the first copper plate 522 serving as the circuit layer 512 and the ceramic substrate 511 are bonded to each other (circuit layer forming process S501), and the second copper plate 523 serving as the metal layer 513 and the ceramic substrate 511 are bonded to each other (second metal layer forming process S502). In this embodiment, the circuit layer forming process S501 and the second metal layer forming process S502 are carried out simultaneously.

First, as shown in FIGS. 21 and 22, the $Al_2O_3$ layers 525 and 526 are formed on one surface and the other surface of the ceramic substrate 511 formed from AlN (second alumina forming process S510). In the second alumina layer forming process S510, an AlN oxidizing treatment is carried out at 1200° C. or higher in an Ar—$O_2$ mixed gas atmosphere. An oxygen partial pressure $P_{O2}$ is set to 10 kPa, and a water-vapor partial pressure $P_{H2O}$ is adjusted to 0.05 kPa. The AlN oxidizing treatment is carried out in the atmosphere of high-oxygen partial pressure and low-water-vapor partial pressure, and thus dense $Al_2O_3$ layers 525 and 526 excellent in adhesiveness with AlN is formed. The thickness of the $Al_2O_3$ layers 525 and 526 is set to 1 μm or more.

The oxygen partial pressure is adjusted by deoxidizing a high-purity Ar gas and then by mixing an oxygen gas into the Ar gas. In addition, the water-vapor partial pressure is adjusted by carrying out a dehydration treatment by allowing this atmospheric gas to pass through a dry system in which silica gel and diphosphorous pentaoxide are filled, and then by allowing the atmospheric gas to pass through water adjusted to a predetermined temperature.

Next, the first copper plate 522 is laminated on the one surface side of the ceramic substrate 511. In addition, the second copper plate 523 is laminated on the other surface side of the ceramic substrate 511 (lamination process S511). That is, the $Al_2O_3$ layer 525 is interposed between the ceramic substrate 511 and the first copper plate 522, and the $Al_2O_3$ layer 526 is interposed between the ceramic substrate 511 and the second copper plate 523.

Next, the first copper plate 522, the ceramic substrate 511, and the second copper plate 523 are heated in an oxygen-containing atmosphere in a compressed state in a lamination direction (heating process S512). In this embodiment, the heating temperature is set in a range of 1065 to 1083° C.

According to this process, as shown in FIG. 22, a first molten metal region 555 is formed at an interface between the first copper plate 522 and the ceramic substrate 511, and a second molten metal region 556 is formed at an interface between the ceramic substrate 511 and the second copper plate 523. These first molten metal region 555 and the second molten metal region 556 are formed when a melting point is lowered due to a eutectic reaction between copper (Cu) and cuprous oxide ($Cu_2O$).

Next, a temperature is lowered to solidify the first molten metal region 555 and the second molten metal region 556 (solidification process S513).

In this manner, the first copper plate 522, the ceramic substrate 511, and the second copper plate 523 are bonded, whereby the power module substrate 510 according to this embodiment is manufactured.

According to the power module substrate 510 of this embodiment which has the above-described configuration, the circuit layer 512 is formed by the first copper plate 522. Accordingly, radiation of heat transferred from a heat generation body such as a semiconductor device that is mounted on the mounting surface 512A of the circuit layer 512 can be efficiently promoted.

In addition the circuit layer 512 and the metal layer 513 are formed by the first and second copper plates 522 and 523 which contain 10 mol ppm of Zr. Accordingly, Zr reacts with S (sulfur) that is present as one of unavoidable impurities in copper to generate a sulfide, and thus an effect of S can be suppressed. According to this, a recrystallization temperature of the first copper plate 522 (circuit layer 512) and the second copper plate 523 (metal layer 513) is lowered, and thus strain hardening is suppressed. According to this, occurrence of cracking in the ceramic substrate 511 during loading of a cooling and heating cycle can be suppressed.

In addition, in this embodiment, the $Al_2O_3$ layer 525 is formed on one surface of the ceramic substrate 511 formed from AlN, the $Al_2O_3$ layer 526 is formed on the other surface thereof, and the first and second copper plates 522 and 523 and the ceramic substrate 511 are bonded, respectively, using the $Al_2O_3$ layers 525 and 526 according to the DBC method. Accordingly, the first and second copper plates 522 and 523 and the ceramic substrate 511 can be strongly bonded to each other. In this manner, even in the ceramic substrate 511 formed from AlN, bonding of the first and second copper plates 522 and 523 by using the DBC method is possible.

Further, in the second alumina layer forming process S510, the thickness of the $Al_2O_3$ layers 525 and 526 that are formed is set to 1 μm or more. Accordingly, the first and second copper plates 522 and 523 and the ceramic substrate 511 can be reliably bonded to each other.

In addition, in this embodiment, since the AlN oxidizing treatment is carried out in the atmosphere of high-oxygen partial pressure and low-water-vapor partial pressure, and thus the dense $Al_2O_3$ layers 525 and 526 excellent in adhesiveness with AlN is formed. Accordingly, occurrence of peeling between the ceramic substrate 511 formed from AlN and the $Al_2O_3$ layers 525 and 526 can be prevented.

Next, a seventh embodiment of the present invention will be described with reference to FIGS. 23 to 25.

Figure 23:
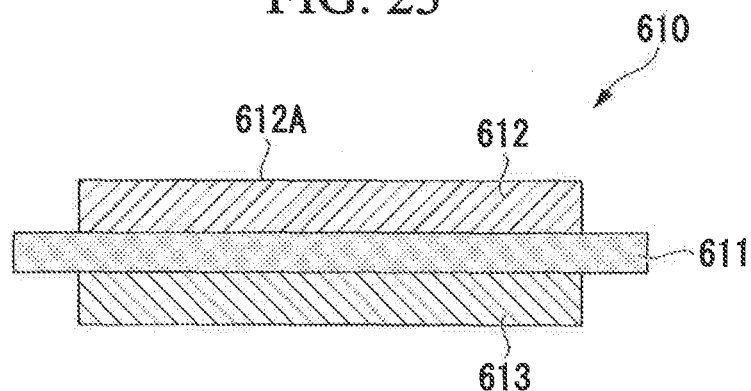
FIG. 23 is a schematic explanatory diagram of a power module substrate according to a seventh embodiment of the present invention.

A power module substrate 610 which is shown in FIG. 23 includes a ceramic substrate 611, a circuit layer 612, and a metal layer 613. The circuit layer 612 is formed on one surface (in FIG. 23, the upper surface) of the ceramic substrate 611. The metal layer 613 is formed on the other surface (in FIG. 23, the lower surface) of the ceramic substrate 611.

The ceramic substrate 611 prevents electrical connection between the circuit layer 612 and the metal layer 613 and is composed of AlN with high insulating properties. In addition, the thickness of the ceramic substrate 611 is set in a range of 0.2 to 1.5 mm, and is set to 0.635 mm in this embodiment.

Figure 25:
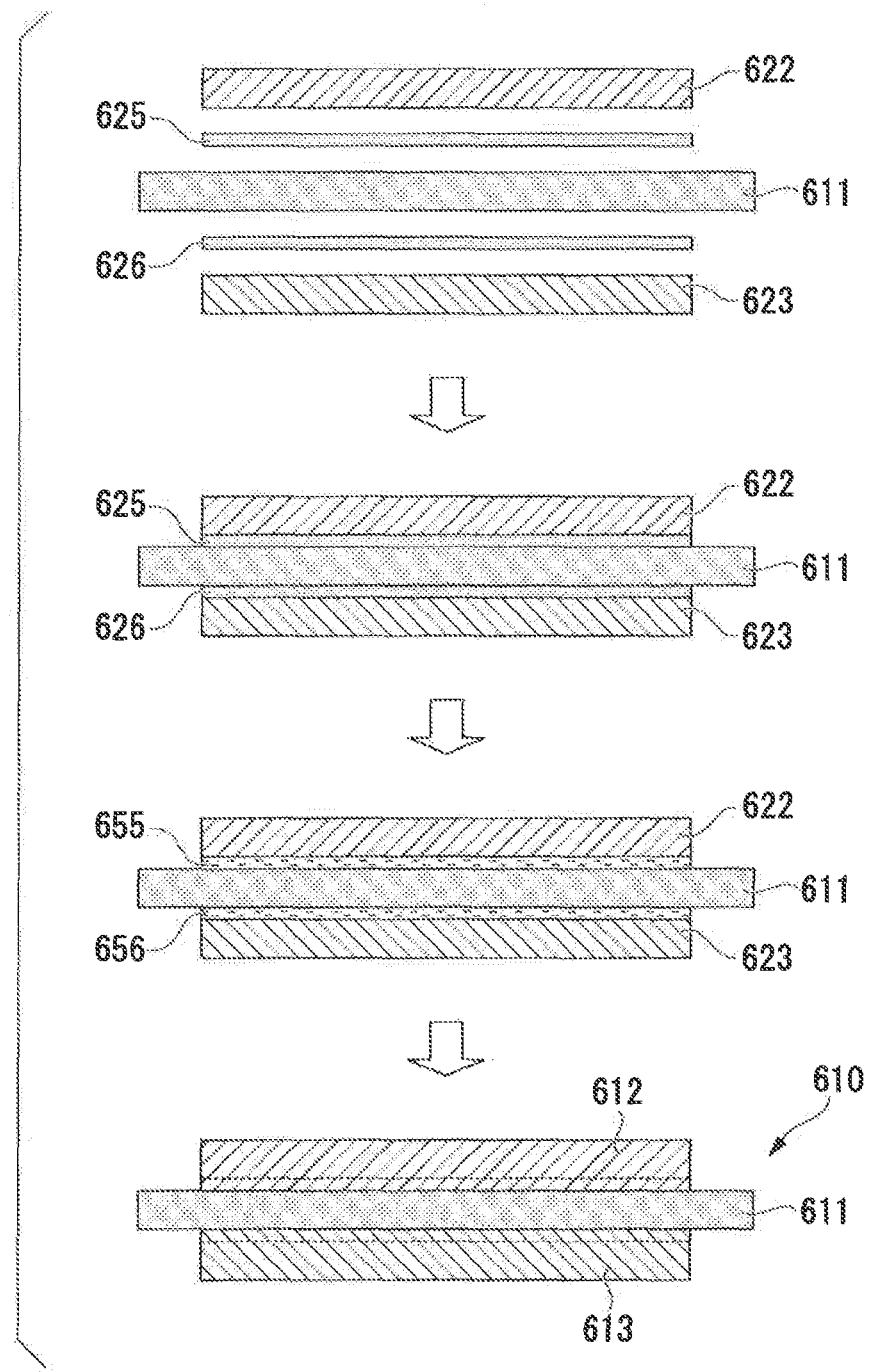
FIG. 25 is an explanatory diagram illustrating the method of manufacturing the power module substrate according to the seventh embodiment of the present invention.

As shown in FIG. 25, the circuit layer 612 is formed by bonding a first copper plate 622 onto one surface (in FIG. 25, the upper surface) of the ceramic substrate 611. The thickness of the circuit layer 612 is set in a range of 0.1 to 1.0 mm, and is set to 0.3 mm in this embodiment. A circuit pattern is formed in the circuit layer 612, and one surface (in FIG. 23, the upper surface) is set as a mounting surface 612A on which an electronic component such as a semiconductor device is mounted.

As shown in FIG. 25, the metal layer 613 is formed by bonding a second copper plate 623 onto the other surface (in FIG. 25, the lower surface) of the ceramic substrate 611. The thickness of the metal layer 613 is set in a range of 0.1 to 1.0 mm, and is set to 0.3 mm in this embodiment.

Prior to bonding, all of the first copper plate 622 (circuit layer 612) and the second copper plate 623 (metal layer 613) have the same configuration (composition) as that of the first copper plate 22 described in the first embodiment. In this embodiment, La-doped copper obtained by adding 7 mol ppm of La instead of Mg described in the first embodiment to oxygen-free copper (OFC) having purity of 99.99% by mass or more is used for the first copper plate 622 (circuit layer 612) and the second copper plate 623 (metal layer 613).

Hereinafter, a method of manufacturing the power module substrate 610 which has the above-described configuration will be described with reference to FIGS. 24 and 25.

Figure 24:
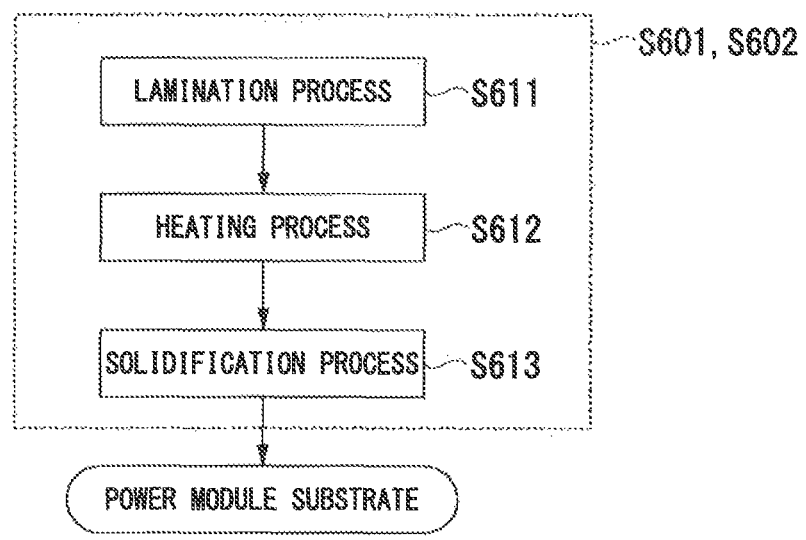
FIG. 24 is a flow chart of a method of manufacturing the power module substrate according to the seventh embodiment of the present invention.

As shown in FIGS. 24 and 25, in this embodiment, the first copper plate 622 serving as the circuit layer 612 and the ceramic substrate 611 are bonded to each other (circuit layer forming process S601), and the second copper plate 623 serving as the metal layer 613 and the ceramic substrate 611 are bonded to each other (second metal layer forming process S602). In this embodiment, the circuit layer forming process S601 and the second metal layer forming process S602 are carried out simultaneously.

The first and second copper plates 622 and 623 and the ceramic substrate 611 are bonded, respectively, according to a so-called active-metal method.

First, the first copper plate 622 is laminated on one surface side of the ceramic substrate 611. In addition, the second copper plate 623 is laminated on the other surface side of the ceramic substrate 611 (lamination process S611). At this time, as shown in FIG. 25, a brazing material 625 formed from Ag—Cu—Ti is provided between the first copper plate 622 and the ceramic substrate 611, and a brazing material 626 formed from Ag—Cu—Ti is provided between the ceramic substrate 611 and the second copper plate 623.

In this embodiment, as the brazing material 625 and 626, a brazing material having a composition of Ag-27.4% by mass of Cu-2.0% by mass of Ti is used.

Next, the first copper plate 622, the ceramic substrate 611, and the second copper plate 623 are heated in a vacuum atmosphere in a compressed state in a lamination direction (heating process S612). In this embodiment, heating is carried out in a vacuum atmosphere of $10^{-3}$ Pa under conditions of 850° C. and 10 minutes.

According to this process, as shown in FIG. 25, a first molten metal region 655 is formed at an interface between the first copper plate 622 and the ceramic substrate 611, and a second molten metal region 656 is formed at an interface between the ceramic substrate 611 and the second copper plate 623.

Next, a temperature is lowered to solidify the first molten metal region 655 and the second molten metal region 656 (solidification process S613).

In this manner, the first copper plate 622, the ceramic substrate 611, and the second copper plate 623 are bonded, whereby the power module substrate 610 according to this embodiment is manufactured.

According to the power module substrate 610 of this embodiment which has the above-described configuration, the circuit layer 612 is formed by the first copper plate 622. Accordingly, radiation of heat transferred from a heat generation body such as a semiconductor device that is mounted on the mounting surface 612A of the circuit layer 612 can be efficiently promoted.

In addition, the circuit layer 612 and the metal layer 613 are formed by the first and second copper plates 622 and 623 which contain 7 mol ppm of La. Accordingly, La reacts with S (sulfur) that is present as one of unavoidable impurities in copper to generate a sulfide, and thus an effect of S can be suppressed. According to this, a recrystallization temperature of the first copper plate 622 (circuit layer 612) and the second copper plate 623 (metal layer 613) is lowered, and thus strain hardening is suppressed. According to this, occurrence of cracking in the ceramic substrate 611 during loading of a cooling and heating cycle can be suppressed.

In addition, the first and second copper plates 622 and 623 and the ceramic substrate 611 are bonded, respectively, according to the active-metal method using the brazing materials 625 and 626 of Ag—Cu—Ti. Accordingly, the power module substrate 610 can be configured without interposing oxygen at the interface between the first and second copper plates 622 and 623 and the ceramic substrate 611.

Hereinbefore, the embodiments of the present invention have been described. However, the present invention is not limited thereto, and can be appropriately modified in a range not departing from the technical spirit of the present invention.

For example, description has been made with respect to a case in which the ceramic substrate is composed of $Al_2O_3$ or AlN. However, it is not limited thereto, and the ceramic substrate may be composed of $Si_3N_4$ or the like.

In addition, in the first, second, and third embodiments, description has been made with respect to a case in which the aluminum plate that forms the metal layer is set to a rolled plate of pure aluminum having purity of 99.99% or more, but it is not limited thereto.

In addition, in the second and sixth embodiments, description has been made with respect to a case in which AlN is subjected to an oxidizing treatment to form the $Al_2O_3$ layer. However, it is not limited thereto, and the $Al_2O_3$ layer may be formed on a surface of the ceramic substrate with another means.

Further, in the fixation layer forming process according to the first and second embodiment, description has been made with respect to a case in which the additive element is fixed by sputtering. However, it is not limited thereto, and the additive element may be fixed by deposition, CVD, plating, or application of paste.

In addition, in the first, second, third, and fifth embodiments, description has been made with respect to a case in which the heat sink is composed of an A6063 alloy. However, it is not limited thereto, and the heat sink may be composed of other metal materials such as an A1100 alloy, an A3003 alloy, an A5052 alloy, and an A7N01 alloy.

Further, the structure of the heat sink is not limited to the embodiments, and heat sinks having other structures may be employed.

In addition, description has been made with respect to a configuration in which one power module substrate is bonded onto the heat sink. However, it is not limited thereto, and a plurality of power module substrates may be bonded onto one heat sink.

In addition, in the fifth, sixth, and seventh embodiments, description has been made with respect to a case in which the copper plate that forms the circuit layer and the copper plate that forms the metal layer have the same composition as each other. However, it is not limited thereto, and the copper plate that forms the circuit layer and the copper plate that forms the metal layer may have compositions different from each other.

EXAMPLE 1

Description will be made with respect to comparative experiments that have been carried out to confirm effectiveness of the present invention.

A ceramic substrate which was formed from AlN and which had a thickness of 0.635 mm, copper plates that were formed from doped copper obtained by adding an arbitrary element to oxygen-free copper having a composition shown in Table 1, oxygen-free copper (OFC), and tough pitch copper (TPC) and which had a thickness of 0.3 mm, and aluminum plate which was formed from aluminum (4N Al) having purity of 99.99% by mass and which has a thickness of 1.6 mm were prepared.

The ceramic substrate, one of the copper plates, and the aluminum plate were bonded according to the method described in the third embodiment. The compression pressure and the heating temperature in the circuit layer forming process S201 were set to 0.5 kgf/cm$^2$ and 850° C., respectively. In addition, the compression pressure and the heating temperature in the first metal layer forming process S202 were set to 5 kgf/cm$^2$ and 640° C., respectively.

A predetermined times of cooling and heating cycles (from −40 to 110° C., and from 110 to −40° C.) were loaded on the power module substrate to confirm whether or not cracking occurred in the ceramic substrate.

TABLE 1

| | Additive component mol ppm | O ppm by mass | S ppm by mass | Cooling and heating cycle test results (the number of cycles when cracking is confirmed in ceramic substrate) |
|---|---|---|---|---|
| Inventive Example A1 | La: 7 | 0.8 | 5.5 | 3000 times or more |
| Inventive Example A2 | La: 3 | 0.8 | 5.5 | 3000 times or more |
| Inventive Example A3 | La: 22 | 0.8 | 5.5 | 3000 times or more |
| Inventive Example A4 | La: 22 Y: 50 | 0.8 | 5.5 | 2500 to 3000 times |
| Inventive Example A5 | La: 1 | 0.8 | 5.5 | 2500 to 3000 times |
| Inventive Example A6 | La: 1 | 8.5 | 4.5 | 2000 to 2500 times |
| Inventive Example A7 | Y: 10 | 0.8 | 5.5 | 3000 times or more |
| Inventive Example A8 | Mg: 15 | 0.8 | 5.5 | 3000 times or more |
| Inventive Example A9 | Ca: 15 | 0.8 | 5.5 | 3000 times or more |
| Inventive Example A10 | Zr: 10 | 0.8 | 5.5 | 3000 times or more |
| Inventive Example A11 | Ti: 10 | 0.8 | 5.5 | 3000 times or more |
| Inventive Example A12 | V: 10 | 0.8 | 5.5 | 3000 times or more |
| Inventive Example A13 | B: 500 | 0.8 | 5.5 | 3000 times or more |
| Inventive Example A14 | B: 100 | 0.8 | 5.5 | 2500 to 3000 times |
| Conventional Example A1 | TPC | 236 | 10.2 | 500 to 1000 times |
| Conventional Example A2 | OFC | 0.8 | 5.5 | 1000 to 1500 times |

In Conventional Example A1 using the tough pitch copper and Conventional Example A2 using the oxygen-free copper (OFC), it was recognized that cracking occurred in the ceramic substrate during loading of the cooling and heating cycle from 1000 times to 2000 times.

On the contrary, in Inventive Examples A1 to A14 which contain either a total of 1 to 100 mol ppm of one or more kinds among an alkaline-earth element, a transition metal element, and a rare-earth element, or 100 to 1000 mol ppm of boron, cracking was not recognized in the ceramic substrate at the point of time when the cooling and heating cycle was loaded 2000 times. Particularly, in Inventive Examples A1 to A3, and A7 to A13 which contain either a total of 3 to 50 mol ppm of one or more kinds among an alkaline-earth element, a transition metal element, and a rare-earth element, or 300 to 1000 mol ppm of boron, cracking was not recognized in the ceramic substrate even at the point of time when the cooling and heating cycle was loaded 3000 times.

Further, when comparing Inventive Example A5 and inventive Example A6 which were different in the content of oxygen, it was confirmed that prevention of cracking of the ceramic substrate was higher in Inventive Example A5 in which the content of oxygen was set to 1 ppm by mass or less.

EXAMPLE 2

Description will be made with respect to comparative experiments that have been carried out to confirm attentiveness of the present invention.

A ceramic substrate which was formed from $Al_2O_3$ and which had a thickness of 0.635 mm, and copper plates which were formed from copper or a copper alloy having compositions shown in Table 2 and which had a thickness of 0.3 mm were prepared.

One of the copper plates, the ceramic substrate, and one of the copper plates were bonded according to the method described in the seventh embodiment. The compression pressure and the heating temperature in the circuit layer forming process S601 and the second metal layer forming process S602 were set to 0.5 kgf/cm$^2$ and 850° C., respectively.

A predetermined times of cooling and heating cycles (from −40 to 110° C., and from 110 to −40° C.) were loaded on the power module substrate to confirm whether or not cracking occurred in the ceramic substrate.

TABLE 2

| | Additive component mol ppm | O ppm by mass | S ppm by mass | Cooling and heating cycle test results (the number of cycles when cracking is confirmed in ceramic substrate) |
|---|---|---|---|---|
| Inventive Example B1 | La: 7 | 0.8 | 5.5 | 3000 times or more |
| Inventive Example B2 | La: 3 | 0.8 | 5.5 | 3000 times or more |
| Inventive Example B3 | La: 22 | 0.8 | 5.5 | 3000 times or more |
| Inventive Example B4 | La: 22 Y: 50 | 0.8 | 5.5 | 2500 to 3000 times |
| Inventive Example B5 | La: 1 | 0.8 | 5.5 | 2500 to 3000 times |
| Inventive Example B6 | La: 1 | 8.5 | 4.5 | 2000 to 2500 times |
| Inventive Example B7 | Y: 10 | 0.8 | 5.5 | 3000 times or more |
| Inventive Example B8 | Mg: 15 | 0.8 | 5.5 | 3000 times or more |
| Inventive Example B9 | Ca: 15 | 0.8 | 5.5 | 3000 times or more |
| Inventive Example B10 | Zr: 10 | 0.8 | 5.5 | 3000 times or more |
| Inventive Example B11 | Ti: 10 | 0.8 | 5.5 | 3000 times or more |
| Inventive Example B12 | V: 10 | 0.8 | 5.5 | 3000 times or more |
| Inventive Example B13 | B: 500 | 0.8 | 5.5 | 3000 times or more |
| Inventive Example B14 | B: 100 | 0.8 | 5.5 | 2500 to 3000 times |
| Conventional Example B1 | TPC | 236 | 10.2 | 500 to 1000 times |
| Conventional Example B2 | OFC | 0.8 | 5.5 | 1000 to 1500 times |

In Conventional Example B1 using the tough pitch copper and Conventional Example B2 using the oxygen-free copper (OFC), it was recognized that cracking occurred in the ceramic substrate during loading of the cooling and heating cycle from 1000 times to 2000 times.

On the contrary, in Inventive Examples B1 to B14 which contain either a total of 1 to 100 mol ppm of one or more kinds among an alkaline-earth element, a transition metal element, and a rare-earth element, or 100 to 1000 mol ppm of boron, cracking was not recognized in the ceramic substrate at the point of time when the cooling and heating cycle was loaded 2000 times. Particularly, in Inventive Examples B1 to B3 and B7 to B13 which contain either a total of 3 to 50 mol ppm of one or more kinds among an alkaline-earth element, a transition metal element, and a rare-earth element, or 300 to 1000 mol ppm of boron, cracking was not recognized in the ceramic substrate even at the point of time when the cooling and heating cycle was loaded 3000 times.

Further, when comparing Inventive Example B5 and Inventive Example B6 which were different in the content of oxygen, it was confirmed that prevention of cracking of the ceramic substrate was higher in Inventive Example B5 in which the content of oxygen was set to 1 ppm by mass or less.

Industrial Applicability

According to the present invention, a power module substrate and a power module substrate with a heat sink which are capable of effectively radiating heat transferred from the electronic component mounted on the circuit layer and which are capable of suppressing occurrence of cracking in the insulating substrate during loading of a cooling and heating cycle, a power module, and a method of manufacturing a power module substrate may be provided.

Reference Signs List
1, 101, 301, 401: Power module
3: Semiconductor device (electronic component)
10, 110, 210, 310, 410, 510, 610: Power module substrate
11, 111, 211, 311, 411, 511, 611: Ceramic substrate (insulating substrate)
12, 112, 212, 312, 412, 512, 612: Circuit layer
13, 113, 213, 313, 413, 513, 613: Metal layer
22, 122, 222, 422, 522, 622: First copper plate
423, 523, 623: Second copper plate
23, 123, 223: Aluminum plate
30: Bonding interface (ceramic substrate/metal layer)
32: High additive-element concentration portion
35: Bonding interface (metal layer/heat sink)
40, 140, 340, 440: Power module substrate with heat sink
41, 141, 341, 441: Heat sink
125, 525, 526: $Al_2O_3$ layer

The invention claimed is:

1. A power module substrate, the substrate comprising:
an insulating substrate; and
a circuit layer that is formed on one surface of the insulating substrate,
wherein the circuit layer is formed by bonding a first copper plate onto the one surface of the insulating substrate, and
wherein, prior to bonding, the first copper plate consists essentially of:
copper, and
either:
a total of 1 to 100 mol ppm of one or more alkaline-earth elements, transition metal elements, and rare-earth elements; or
100 to 1000 mol ppm of boron.

2. The power module substrate according to claim 1, further comprising:
a metal layer that is formed on the other surface of the insulating substrate,
wherein the metal layer is formed by bonding an aluminum plate onto the other surface of the insulating substrate.

3. The power module substrate according to claim 1,
wherein, prior to bonding, the first copper plate consists essentially of:
copper, and
either:
a total of 3 to 50 mol ppm of one or more alkaline-earth elements, transition metal elements, and rare-earth elements; or
300 to 1000 mol ppm of boron.

4. The power module substrate according to claim 1,
wherein in the first copper plate that forms the circuit layer, the content of oxygen is set to 1 ppm by mass or less.

5. The power module substrate according to claim 2,
wherein in the metal layer, any one or more kinds of additive elements among Si, Cu, Ag, Zn, Mg, Ge, Ca, Ga, and Li are contained in a bonding interface with the insulating substrate in a solid solution state, and
the total concentration of the additive elements in the metal layer in the vicinity of the bonding interface is set in a range of 0.01 to 5% by mass.

6. The power module substrate according to claim 2,
wherein in the metal layer, a high additive-element concentration portion, in which the concentration of any one or more kinds of the additive elements among Si, Cu, Ag, Zn, Mg, Ge, Ca, Ga, and Li is set to two or more times the concentration of the additive elements in the metal layer, is formed at the bonding interface with the insulating substrate.

7. The power module substrate according to claim 1, further comprising:
a metal layer that is formed on the other surface of the insulating substrate,
wherein the metal layer is formed by bonding a second copper plate to the other surface of the insulating substrate, and
wherein, prior to bonding, the second copper plate consists essentially of:
copper; and
either;
a total of 1 to 100 mol ppm of one or more alkaline-earth elements, transition metal elements, and rare-earth elements; or
100 to 1000 mol ppm of boron.

8. The power module substrate according to claim 7,
wherein prior to bonding, at least one of the first copper plate and the second copper plate consists essentially of:
copper, and
either:
a total of 3 to 50 mol ppm of one or more alkaline-earth elements, transition metal elements, and rare-earth elements; or
300 to 1000 mol ppm of boron.

9. The power module substrate according to any claim 7, wherein in at least one of the first copper plate and the second copper plate, the content of oxygen is set to 1 ppm by mass or less.

10. A power module substrate with a heat sink, the substrate comprising:
the power module substrate according to claim 1; and
a heat sink that is provided on the other surface side of the insulating substrate.

11. A power module with a heat sink, comprising:
the power module substrate with a heat sink according to claim 10; and
an electronic component that is mounted on the circuit layer.

12. A power module comprising:
the power module substrate according to claim 1; and
an electronic component that is mounted on the circuit layer.

13. A method of manufacturing a power module substrate which is provided with an insulating substrate, a circuit layer formed on one surface of the insulating substrate, and a metal layer formed on the other surface of the insulating substrate, in which the circuit layer is formed by bonding a first copper plate onto the one surface of the insulating substrate, the metal layer is formed by bonding an aluminum plate onto the other surface of the insulating substrate, and prior to bonding, the first copper plate consists essentially of:
copper, and
either:
a total of 1 to 100 mol ppm of one or more alkaline-earth elements, transition metal elements, and rare-earth elements; or
100 to 1000 mol ppm of boron,
the method comprising:
a circuit layer forming process of forming the circuit layer by bonding the first copper plate onto the one surface of the insulating substrate; and
a first metal layer forming process of forming the metal layer by bonding the aluminum plate onto the other surface of the insulating substrate,
wherein in the first metal layer forming process, any one or more kinds of additive elements among Si, Cu, Ag, Zn, Mg, Ge, Ca, Ga, and Li are disposed at a bonding interface of the aluminum plate, and then the aluminum plate is bonded.

14. A power module substrate with a heat sink, the substrate comprising:
the power module substrate according to claim 7; and
a heat sink that is provided on the other surface side of the insulating substrate.

15. A power module with a heat sink, comprising:
the power module substrate with a heat sink according to claim 14; and
an electronic component that is mounted on the circuit layer.

16. A power module comprising:
the power module substrate according to claim 7; and
an electronic component that is mounted on the circuit layer.

* * * * *